(12) United States Patent
Go et al.

(10) Patent No.: US 10,608,026 B2
(45) Date of Patent: Mar. 31, 2020

(54) IMAGE SENSORS

(71) Applicant: Samsung Electronics Co., Ltd., Suwon-si, Gyeonggi-do (KR)

(72) Inventors: Jonghyun Go, Seongnam-si (KR); Jae-Kyu Lee, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 252 days.

(21) Appl. No.: 15/650,102

(22) Filed: Jul. 14, 2017

(65) Prior Publication Data

US 2018/0182794 A1 Jun. 28, 2018

(30) Foreign Application Priority Data

Dec. 28, 2016 (KR) .................. 10-2016-0181449

(51) Int. Cl.
*H01L 27/146* (2006.01)

(52) U.S. Cl.
CPC .. *H01L 27/14612* (2013.01); *H01L 27/14636* (2013.01); *H01L 27/14638* (2013.01); *H01L 27/14641* (2013.01); *H01L 27/14643* (2013.01); *H01L 27/14683* (2013.01)

(58) Field of Classification Search
CPC ......... H01L 27/14612; H01L 27/14636; H01L 27/14638; H01L 27/14641; H01L 27/14643; H01L 27/14683
See application file for complete search history.

(56) References Cited

U.S. PATENT DOCUMENTS

| | | | |
|---|---|---|---|
| 8,158,921 B2 | 4/2012 | McKee | |
| 9,041,073 B2 | 5/2015 | Ahn et al. | |
| 2010/0006910 A1* | 1/2010 | Tani | H01L 27/14609 257/292 |
| 2013/0188085 A1 | 7/2013 | Shim et al. | |
| 2013/0256509 A1 | 10/2013 | Yang et al. | |
| 2014/0103412 A1 | 4/2014 | Lee et al. | |
| 2016/0086984 A1 | 3/2016 | Wang et al. | |

FOREIGN PATENT DOCUMENTS

KR 10-1580323 B1 12/2015

\* cited by examiner

*Primary Examiner* — Georgia Y Epps
*Assistant Examiner* — Don J Williams
(74) *Attorney, Agent, or Firm* — Harness, Dickey & Pierce, P.L.C.

(57) ABSTRACT

An image sensor for securing an area of a photodiode includes a pixel area and a transistor area adjacent to the pixel area. The pixel area may include a photodiode and a floating diffusion area. The transistor area may include transistors extending along an edge of the pixel area. The transistors in the transistor area may include a reset transistor, one or more source follower transistors, and one or more selection transistors, and the reset transistor and one source follower transistor adjacent to the reset transistor may share a common drain area. The source follower transistors and the selection transistors may each share a common source area or a common drain area between two adjacent transistors thereof.

20 Claims, 18 Drawing Sheets

IMAGE SENSORS

CROSS-REFERENCE TO RELATED APPLICATIONS

This application claims the benefit, under 35 U.S.C. § 119, of Korean Patent Application No. 10-2016-0181449, filed on Dec. 28, 2016, in the Korean Intellectual Property Office, the disclosure of which is incorporated herein in its entirety by reference.

BACKGROUND

The inventive concepts relate to an image sensor, and more particularly, to an image sensor including a source follower transistor and a selection transistor.

Image sensors generally each include a plurality of unit pixels which are two-dimensionally arrayed. In some cases, each unit pixel of the plurality of unit pixels may include a photodiode and a plurality of pixel transistors. For example, the plurality of pixel transistors may include a transfer transistor, a reset transistor, a source follower transistor, and a selection transistor.

SUMMARY

The inventive concepts provide an image sensor for securing an area of a photodiode.

According to some example embodiments, an image sensor may include a pixel area and a transistor area adjacent to the pixel area in a first direction. The pixel area may include a photodiode, and a floating diffusion area. The transistor area may include a transistor set, the transistor set including a plurality of transistors extending along a second direction perpendicular to the first direction. The plurality of transistors may include one reset transistor, a plurality of source follower transistors, and at least one selection transistor. A total quantity of transistors, of the plurality of source follower transistors and the at least one selection transistor, may be an even quantity and is at least four transistors. The one reset transistor and an adjacent source follower transistor of the plurality of source follower transistors may share a drain area. Adjacent transistors, of the plurality of source follower transistors and the at least one selection transistor, may each share a source area between the adjacent transistors or a drain area between the adjacent transistors.

According to some example embodiments, an image sensor may include a pixel area and a transistor area adjacent to the pixel area in a first direction. The pixel area may include a photodiode, and a floating diffusion area. The transistor area may include a transistor set, the transistor set including a plurality of transistors extending along a second direction perpendicular to the first direction. The plurality of transistors may include one reset transistor, a plurality of source follower transistors, and a plurality of selection transistors. The plurality of selection transistors may be equal in quantity to the plurality of source follower transistors. A total quantity of transistors, of the plurality of source follower transistors and the plurality of selection transistors, may be an odd quantity that is at least three transistors. The one reset transistor and one source follower transistor adjacent to the one reset transistor, among the plurality of source follower transistors, may share a common drain area. The plurality of source follower transistors and the plurality of selection transistors may each share a common source area or a common drain area between two adjacent transistors of the plurality of source follower transistors and the plurality of selection transistors. Two adjacent selection transistors of the plurality of selection transistors may share a separate common drain area.

According to some example embodiments, an image sensor may include a pixel area and a plurality of transistors adjacent to the pixel area and extending along an edge of the pixel area. The pixel area may include a photodiode and a floating diffusion area. The plurality of transistors may include a reset transistor, a plurality of source follower transistors, and at least one selection transistor. The reset transistor and an adjacent source follower transistor of the plurality of source follower transistors may share a common drain area. Adjacent transistors, of the plurality of source follower transistors and the at least one selection transistor, each share a common source area between the adjacent transistors or a separate common drain area between the adjacent transistors.

BRIEF DESCRIPTION OF THE DRAWINGS

Example embodiments of the inventive concepts will be more clearly understood from the following detailed description taken in conjunction with the accompanying drawings in which.

DETAILED DESCRIPTION

To sufficiently understand elements and effects of the inventive concepts, example embodiments will be described below in detail with reference to the accompanying drawings.

Figure 1A:
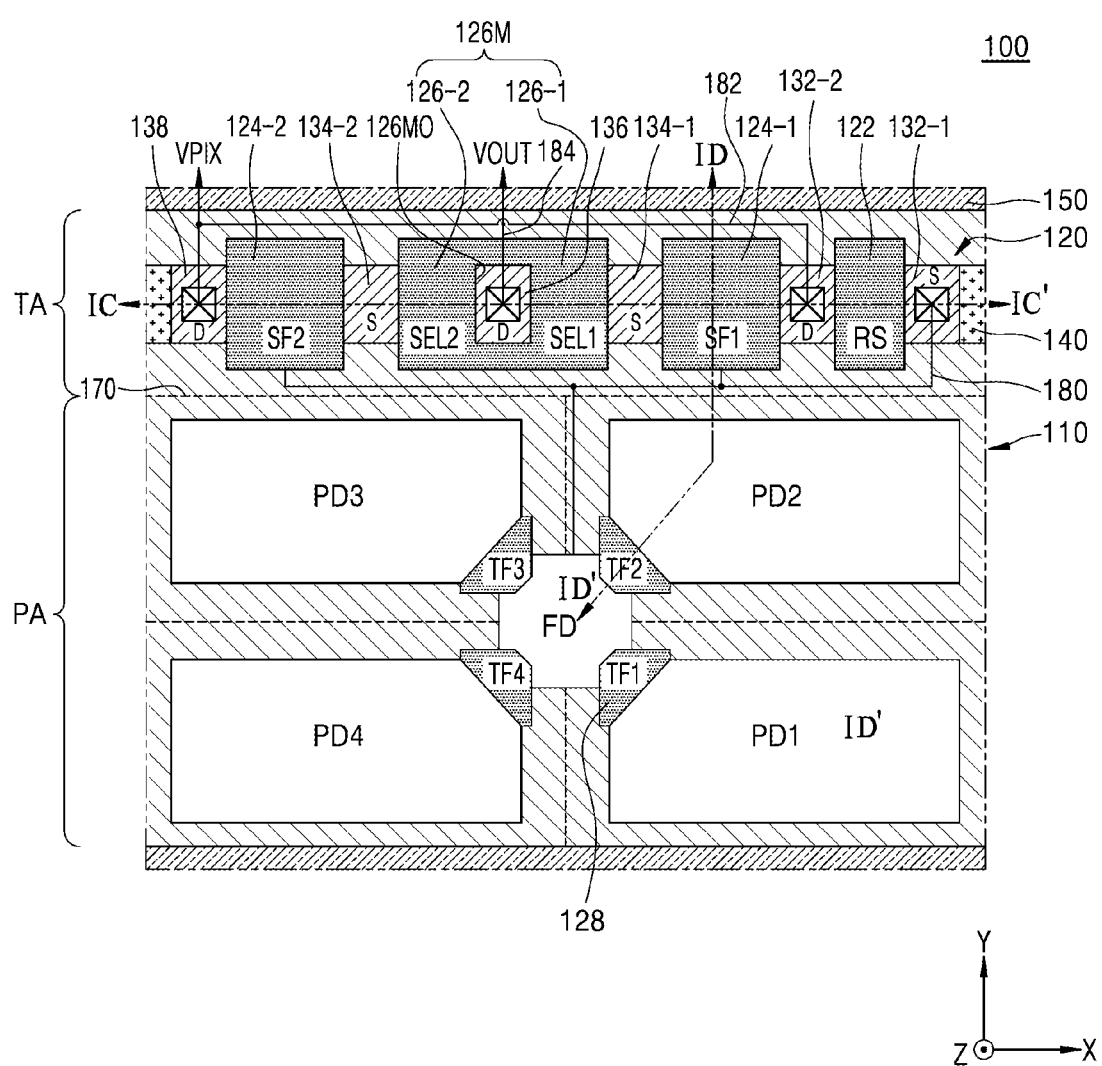
FIG. 1A is a plan view of a main portion of a unit pixel of an image sensor according to some example embodiments.
Figure 1B:
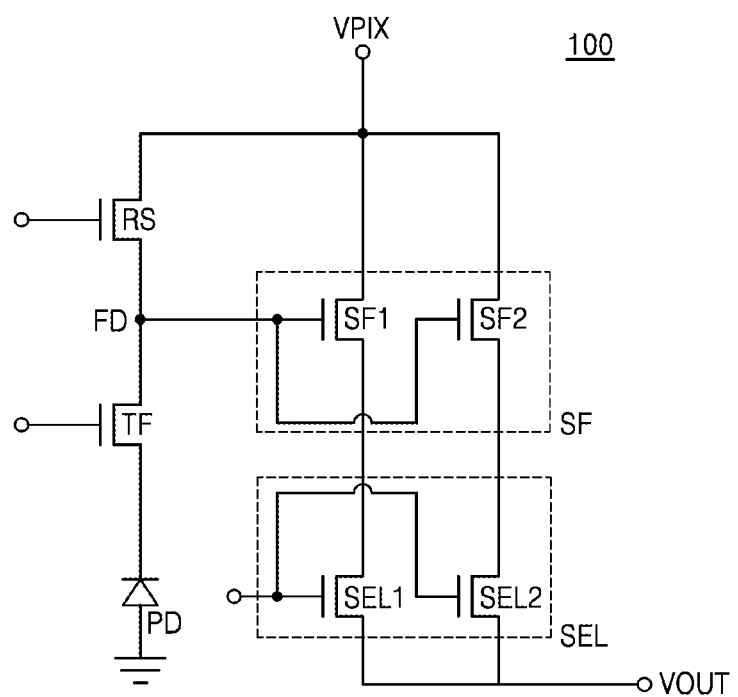
FIG. 1B is an equivalent circuit diagram corresponding to the unit pixel of the image sensor according to some example embodiments.

FIG. 1A is a plan view of a main portion of a unit pixel of an image sensor 100 according to some example embodiments, and FIG. 1B is an equivalent circuit diagram corresponding to the unit pixel of the image sensor 100 according to some example embodiments.

Figure 5:
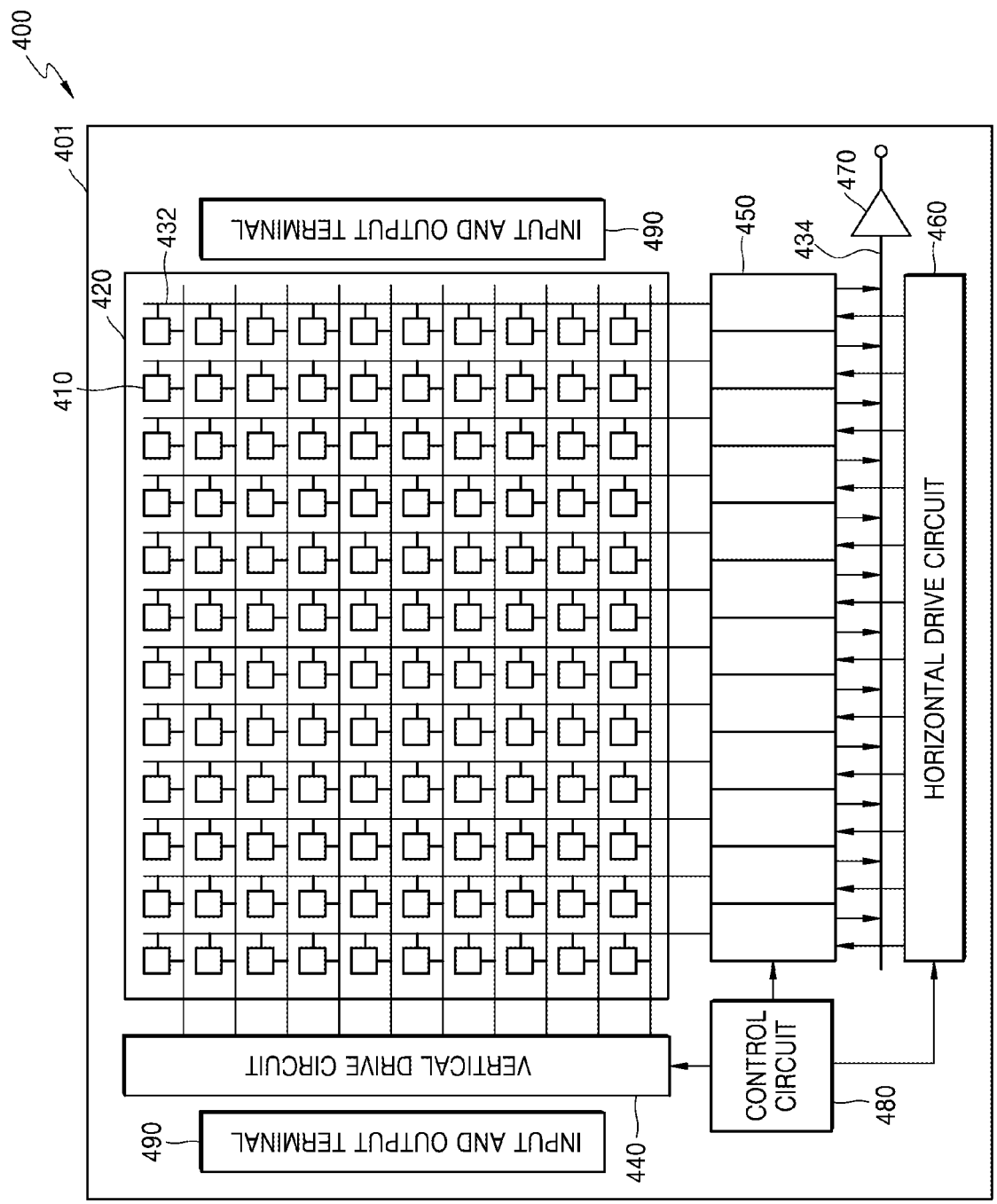
FIG. 5 is a diagram illustrating a schematic configuration of an image sensor according to some example embodiments.

Referring to FIGS. 1A and 1B, the image sensor 100 may include a pixel area PA and a transistor area TA which are provided in a pixel part (420 of FIG. 5). A pixel 110 may be provided in the pixel area PA, and a transistor set 120 may be provided in the transistor area TA. The pixel 110 may include a plurality of photodiodes PD1 to PD4 and a floating diffusion area FD.

In some embodiments, in the pixel 110, four single pixels configured with four photodiodes PD1 to PD4 may configure one sharing pixel along with one floating diffusion area FD. For example, the pixel 110 may have a structure where the four photodiodes PD1 to PD4 share and surround the one floating diffusion area FD.

In the pixel 110, the one floating diffusion area FD may be shared by the four photodiodes PD1 to PD4 through a plurality of transfer transistors TF1 to TF4 respectively corresponding to the photodiodes PD1 to PD4. For example, the photodiodes PD1 to PD4 may include first to fourth photodiodes PD1 to PD4, and the transfer transistors TF1 to TF4 may include first to fourth transfer transistors TF1 to TF4. In detail, the first transfer transistor TF1 corresponding to the first photodiode PD1, the second transfer transistor TF2 corresponding to the second photodiode PD2, the third transfer transistor TF3 corresponding to the third photodiode PD3, and the fourth transfer transistor TF4 corresponding to the fourth photodiode PD4 may share the one floating diffusion area FD as a common drain area. The first to fourth transfer transistors TF1 to TF4 may be respectively configured by a plurality of transfer gate electrodes 128 disposed between the first to fourth photodiodes PD1 to PD4 and the floating diffusion area FD.

In the equivalent circuit diagram of FIG. 1B, only one photodiode PD and one transfer transistor TF are illustrated, and if the pixel 110 includes the four photodiodes PD1 to PD4 and four transfer transistors TF (for example, TF1 to TF4), the four transfer transistors TF1 to TF4 respectively corresponding to the four photodiodes PD1 to PD4 may share the floating diffusion area FD as a drain area (e.g., a "common drain area").

The pixel 110 configuring a sharing pixel may denote the four photodiodes PD1 to PD4 configuring a unit pixel that shares the one floating diffusion area FD, and moreover, may denote that the four photodiodes PD1 to PD4 share the one transistor set 120.

The transistor set 120 may be disposed in the transistor area TA adjacent to the pixel area PA, and one transistor set 120 may be provided per one pixel 110. Therefore, the four photodiodes PD1 to PD4 respectively configuring four unit pixels configuring the pixel 110 may share the one transistor set 120.

In FIG. 1A, four unit pixels including the four photodiodes PD1 to PD4 and the one floating diffusion area FD are illustrated as sharing a sharing pixel in the pixel 110, but the technical spirit of the inventive concepts is not limited thereto. In some embodiments, the pixel 110 may be configured with a single pixel including one photodiode and the one floating diffusion area FD, or two or eight or more photodiodes and two or eight or more unit pixels including the one floating diffusion area FD may configure a sharing pixel.

A plurality of transistors RS, SF1, SF2, SEL1, and SEL2 included in the transistor set 120, as illustrated in FIG. 1A, may be adjacent to a pixel area PA and may extend along an edge 170 of the pixel area PA (e.g., arranged along a first direction (an X direction)). The pixel area PA may be disposed adjacent to a second direction (a Y direction) vertical (also referred to herein as "perpendicular") to the first direction (the X direction) of the transistor area TA.

The transistor set 120 may include a reset transistor RS, a plurality of source follower transistors SF1 and SF2, and a plurality of selection transistors SEL1 and SEL2. For example, the plurality of source follower transistors SF1 and SF2 may include a first source follower transistor SF1 and a second source follower transistor SF2, and the plurality of selection transistors SEL1 and SEL2 may include a first selection transistor SEL1 and a second selection transistor SEL2. In some embodiments, the transistor set 120 may include the reset transistor RS, the first source follower transistor SF1, the first selection transistor SEL1, the second selection transistor SEL2, and the second source follower transistor SF2.

To provide a detailed description of the transistor set 120, the reset transistor RS may include a reset gate electrode 122 and first and second impurity areas 132-1 and 132-2 provided next to both sides of the reset gate electrode 122, the first source follower transistor SF1 may include a first source follower gate electrode 124-1 and the second impurity area 132-2 and a third impurity area 134-1 provided next to both sides of the first source follower gate electrode 124-1, the first selection transistor SEL1 may include a first selection gate electrode 126-1 and the third impurity area 134-1 and a fourth impurity area 136 provided next to both sides of the first selection gate electrode 126-1, the second selection transistor SEL2 may include a second selection gate electrode 126-2 and the fourth impurity area 136 and a fifth impurity area 134-2 provided next to both sides of the second selection gate electrode 126-2, and the second source follower transistor SF2 may include a second source follower gate electrode 124-2 and the fifth impurity area 134-2 and a sixth impurity area 138 provided next to both sides of the second source follower gate electrode 124-2. The first to sixth impurity areas 132-1, 132-2, 134-1, 136, 134-2, and 138 may each be, for example, an n-type high concentration impurity area.

The reset transistor RS and the first source follower transistor SF1 may share the second impurity area 132-2 as a drain area D, the first source follower transistor SF1 and the first selection transistor SEL1 may share the third impurity area 134-1 as a source area S, the first selection transistor SEL1 and the second selection transistor SEL2 may share the fourth impurity area 136 as a drain area D, and the second selection transistor SEL2 and the second source follower transistor SF2 may share the fifth impurity area 134-2 as a source area S.

The first impurity area 132-1, which is the source area S of the reset transistor RS, and the floating diffusion area FD may be electrically connected to each other through a first interconnection structure 180 to have an equivalent ("common") potential. Also, the first source follower gate electrode 124-1 of the first source follower transistor SF1 and the second source follower gate electrode 124-2 of the second source follower transistor SF2 may be electrically connected to the floating diffusion area FD through the first interconnection structure 180. Therefore, the first impurity area 132-1, which is the source area S of the reset transistor RS, the first and second source follower gate electrodes 124-1 and 124-2, and the floating diffusion area FD may all have an equivalent potential (also referred to herein as a "common potential"). Restated, adjacent source follower transistors may share a common source area.

The second impurity area 132-2, which is the drain area D shared by the reset transistor RS and the first source follower transistor SF1 (e.g., a common drain area), and the sixth impurity area 138, which is the drain area D of the second source follower transistor SF2, may be connected to a source voltage VPIX terminal. The second impurity area 132-2 and the sixth impurity area 138 may be connected to the source voltage VPIX terminal through a second interconnection structure 182. Restated, a drain area of one source follower transistor may be electrically connected to a drain area of a reset transistor.

The first selection gate electrode 126-1 of the first selection transistor SEL1 and the second selection gate electrode 126-2 of the second selection transistor SEL2 may be provided as one body. The first selection gate electrode 126-1 and the second selection gate electrode 126-2 may be configured as one body and may be different parts of a coupling selection gate electrode 126M including an internal open space 126MO. Restated, adjacent selection transistors of a plurality of selection transistors may include separate, respective gate electrodes that are included in one common body and include an internal open space. The fourth impurity area 136, which is the drain area D shared by the first selection transistor SEL1 and the second selection transistor SEL2 (e.g., a common drain area shared by two adjacent selection transistors), may be disposed under the open space 126MO of the coupling selection gate electrode 126M.

An output voltage VOUT may be output through the fourth impurity area 136, which is the drain area D shared by the first selection transistor SEL1 and the second selection transistor SEL2. The output voltage VOUT may be output through a third interconnection structure 184 connected to the fourth impurity area 136 through the open space 126MO.

The transistor set 120 disposed in the transistor area TA of the image sensor 100 may be configured with five transistors RS, SF1, SEL1, SEL2, and SF2 which are arranged along the first direction (the X direction) in adjacency to the pixel area PA. The five transistors RS, SF1, SEL1, SEL2, and SF2 may share a source area S (e.g., a common source area) or a drain area D (e.g., a common drain area) between two adjacent transistors and may be arranged along the first direction (the X direction). Therefore, the source area S and the drain area D of each of the five transistors RS, SF1, SEL1, SEL2, and SF2 included in the transistor set 120 may be configured by six impurity areas 132-1, 132-2, 134-1, 136, 134-2, and 138, which are arranged along the first direction (the X direction) and are spaced apart from each other ("isolated from direct contact with each other").

The source area S and the drain area D of each of the five transistors RS, SF1, SEL1, SEL2, and SF2 configured by the six impurity areas 132-1, 132-2, 134-1, 136, 134-2, and 138 may be alternately arranged along the first direction (the X direction).

An isolation area 140 for junction isolation may be disposed adjacent to each of both ends of the transistor set 120, namely, the first impurity area 132-1, which is the source area S of the reset transistor RS, and the sixth impurity area 138, which is the drain area D of the second source follower transistor SF2. In some embodiments, the isolation area 140 may include an isolation layer and a semiconductor layer under the isolation layer. The isolation layer may include, for example, oxide such as silicon oxide (SiO2) or the like. The semiconductor layer may be, for example, a p-type high concentration impurity area. In some embodiments, the isolation area 140 may have a shallow trench isolation (STI) structure where a trench is buried with the isolation layer. As shown in FIG. 1A, two isolations areas 140 may be adjacent to opposite ends of a transistor set in a second direction. In some example embodiments, including the example embodiments shown in FIG. 1A, one isolation area 140 of at least two isolation areas 140 is not between two adjacent transistors of a plurality of transistors included in a transistor set.

In the image sensor 100 according to some example embodiments, two source follower transistors SF1 and SF2 may be connected to each other in parallel, and two selection transistors SEL1 and SEL 2 may be connected to each other in parallel. Also, the first source follower transistor SF1 and the first selection transistor SEL1 may share a source area S, and the second source follower transistor SF2 and the second selection transistor SEL2 may share a source area S. Restated, a plurality of source follower transistors may share common source areas with separate, respective selection transistors of a plurality of selection transistors.

Therefore, if a width of the transistor area TA in the second direction (the Y direction) is narrow, the first and second source follower transistors SF1 and SF2 connected to each other in parallel may perform a function of one source follower transistor SF having a relatively wide channel width, and thus, a transconductance of the source follower transistor SF is improved, thereby increasing a signal transfer speed of the image sensor 100.

Moreover, the first and second selection transistors SEL1 and SEL2 connected to each other in parallel may perform a function of one selection transistor SEL having a wide channel width, and thus, RC delay caused by a reduction in resistance of the selection transistor SEL when seen from an output terminal through which the output voltage VOUT is output is reduced, thereby increasing the signal transfer speed of the image sensor 100.

Furthermore, a source area S and a drain area D of each of five transistors RS, SF1, SEL1, SEL2, and SF2 may be configured with six impurity areas 132-1, 132-2, 134-1, 136, 134-2, and 138, and four impurity areas 132-2, 134-1, 136, and 134-2 configuring a source area S or a drain area D between two adjacent transistors of the five transistors RS, SF1, SEL1, SEL2, and SF2 may be shared, whereby a separate isolation area for junction isolation may not be disposed in one transistor set 120. Accordingly, a dark current or noise occurring when the separate isolation area is disposed in the one transistor set 120 is limited and/or prevented.

A pixel isolation area 150 may be disposed near a pixel part 420 including the pixel area PA and the transistor area TA. In some embodiments, the pixel isolation area 150 may be disposed adjacent to each of one end of a second direction (a Y direction) of the transistor area TA which is a direction opposite to the pixel area PA and one end of a second direction (a Y direction) of the pixel area PA which is a direction opposite to the transistor area TA. In some embodiments, the pixel isolation area 150 may be disposed to surround a periphery of the pixel part 420 including the pixel area PA and the transistor area TA.

In some embodiments, the pixel isolation area 150 may include an isolation layer and a semiconductor layer under the isolation layer. The isolation layer may include, for example, oxide such as silicon oxide (SiO2) or the like. The semiconductor layer may be, for example, a p-type high concentration impurity area. In some embodiments, the pixel isolation area 150 may have a deep trench isolation (DTI) structure where a trench is buried with the isolation layer. A depth of the pixel isolation area 150 in a third direction (a Z direction) vertical to the first and second directions (the X and Y directions) may be greater than a depth of the isolation area 140.

In FIG. 1A, a contact mark (a tetragon with x illustrated therein) is illustrated in only each of the first, second, fourth, and sixth impurity areas 132-1, 132-2, 136, and 138, but a contact disposed in the image sensor 100 is not limited thereto. The contact mark is for distinguishing a portion which is not distinguished from a portion where a contact (166 of FIG. 1C) is provided in the first to sixth impurity areas 132-1, 132-2, 134-1, 136, 134-2, and 138, and is illustrated in only an impurity area of the transistor area TA. That is, the contact 166 may be provided in the first, second, fourth, and sixth impurity areas 132-1, 132-2, 136, and 138 of the first to sixth impurity areas 132-1, 132-2, 134-1, 136, 134-2, and 138, and a contact may not be provided in the third and fifth impurity areas 134-1 and 134-2.

The contact 166 provided in the first impurity area 132-1 may be a portion of the first interconnection structure 180. The contact 166 provided in each of the second and sixth impurity areas 132-2 and 138 may be a portion of the second interconnection structure 182. The contact 166 provided in the fourth impurity area 136 may be a portion of the first interconnection structure 180.

In the present specification, for convenience of illustration, contacts which are provided on gate electrodes in the transistor area TA, on the transfer gate electrode 128 in the pixel area PA, and in the floating diffusion area FD are not illustrated, and depending on the case, like the first to third interconnection structures 180, 182, and 184, only a connection relationship is illustrated. In some example embodiments, only the contact 166 provided in the floating diffusion area FD is illustrated in FIG. 1D.

Figure 1C:
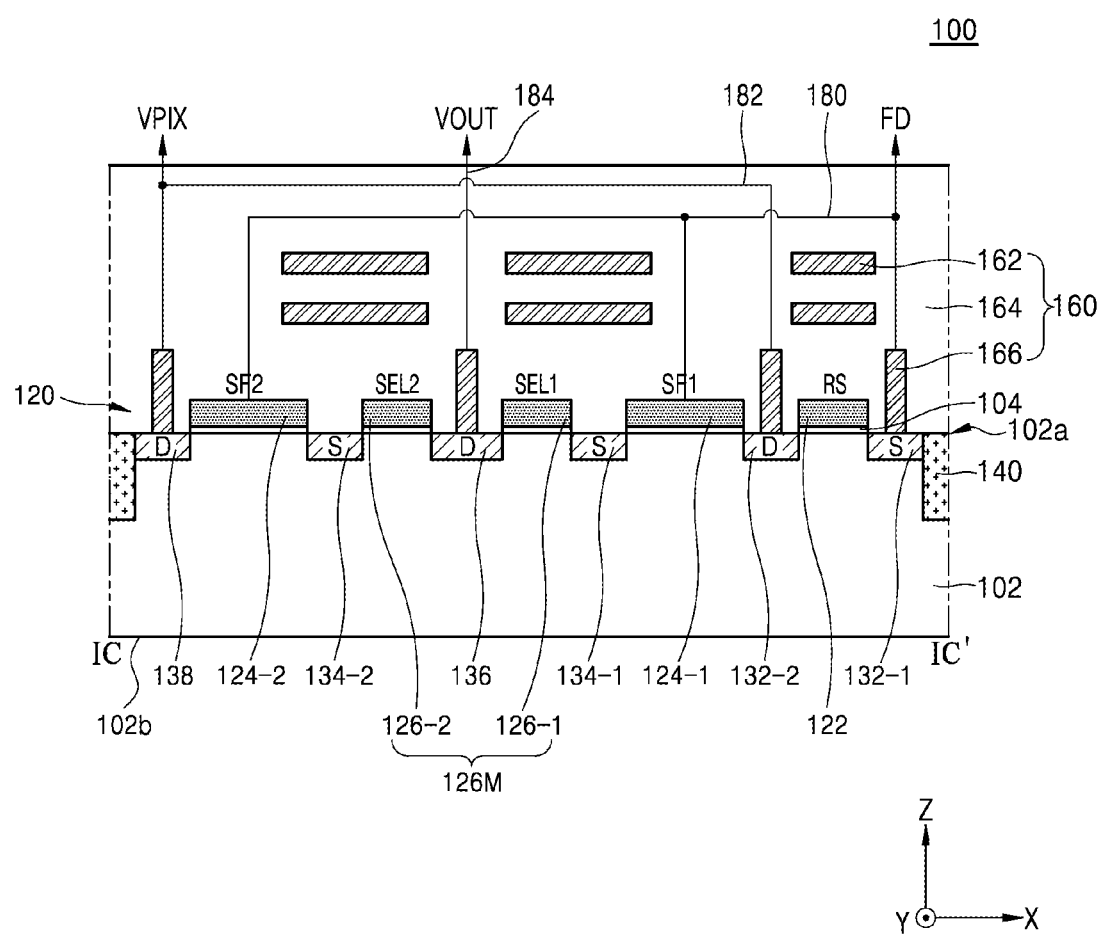
FIGS. 1C and 1D are cross-sectional views of the main portion of the unit pixel of the image sensor according to some example embodiments.
Figure 1D:
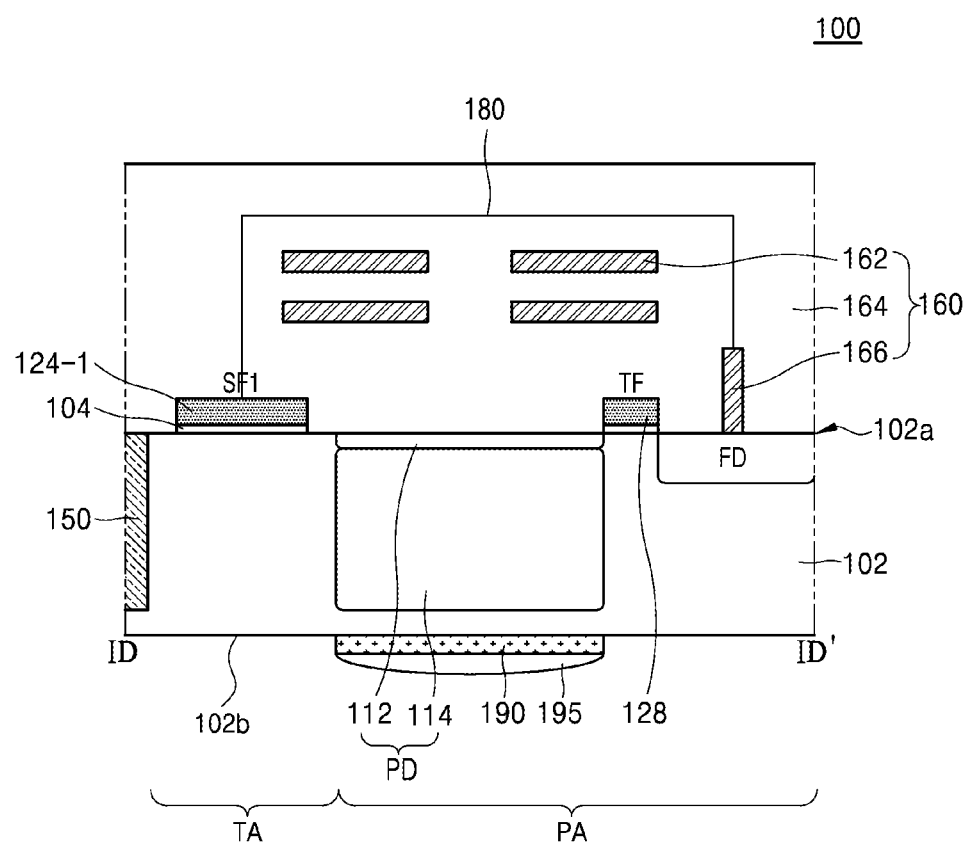

FIGS. 1C and 1D are cross-sectional views of the main portion of the unit pixel of the image sensor 100 according to some example embodiments. In detail, FIG. 1C is a cross-sectional view taken along line IC-IC' of FIG. 1A, and FIG. 1D is a cross-sectional view taken along line ID-ID' of FIG. 1A. Although in FIG. 1A line ID-ID' is taken along the second photodiode PD2 and the second transfer transistor TF2, each of the first to fourth photodiodes PD1 to PD4 and each of the first to fourth transfer transistors TF1 to TF4 have the substantially same cross-sectional structure. Therefore, in FIG. 1D, a photodiode PD and a transfer transistor TF are illustrated without being separately distinguished from each other. Also, in the descriptions with reference to FIGS. 1C and 1D, repeated descriptions given above with reference to FIGS. 1A and 1B are omitted.

Referring to FIGS. 1A to 1D, the image sensor 100 may include the photodiode PD and the transfer transistor TF, which are disposed in the pixel area PA, and the transistor set 120 disposed in the floating diffusion area FD and the transistor area TA.

The photodiode PD may include a first semiconductor area 112 adjacent to a first surface 102a of a substrate 102 and a second semiconductor area 114 under the first semiconductor area 112. The substrate 102 may include silicon, for example, single crystalline silicon, polycrystalline silicon, amorphous silicon, or the like. In some other embodiments, the substrate 102 may include at least one material selected from among Ge, SiGe, SiC, GaAs, InAs, and InP. In some embodiments, the substrate 102 may be a p-type semiconductor substrate. In some other embodiments, the substrate 102 may be a p-type well area provided on a p-type semiconductor substrate or an n-type semiconductor substrate.

In some embodiments, the first semiconductor area 112 may be a p-type impurity area, and the second semiconductor area 114 may be an n-type impurity area.

A color filter layer 190, of which at least a portion overlaps the photodiode PD, and a micro-lens 195 disposed on the color filter layer 190 may be formed on a second surface 102b of the substrate 102.

The color filter layer 190 may transmit light incident through the micro-lens 195 to transfer only light having a desired wavelength to the photodiode PD through the second surface 102b. In some embodiments, an anti-reflection layer (not shown), which limits and/or prevents reflection of light to transfer the light to the photodiode PD, may be formed between the second surface 102b of the substrate 102 and the color filter layer 190. The anti-reflection layer may include, for example, SiON, SiC, SIGN, SiCO, and/or the like.

The micro-lens 195 may be formed to overlap the color filter layer 190 corresponding thereto. The micro-lens 195 may change a path of light incident on an area other than the photodiode PD, thereby concentrating the light on the photodiode PD.

The floating diffusion area FD may be provided in a portion adjacent to the first surface 102a of the substrate 102 adjacent to the photodiode PD. In some embodiments, the floating diffusion area FD may be an n-type high concentration impurity area.

The transfer transistor TF may be disposed between the floating diffusion area FD and the photodiode PD. The transfer transistor TF may include a gate insulation layer 104 formed on the first surface 102a of the substrate 102 and a transfer gate electrode 128 covering the gate insulation layer 104.

The transistor set 120 disposed in the transistor area TA may include the plurality of transistors RS, SF1, SF2, SEL1, and SEL2 arranged along the first direction (the X direction).

The transistor set 120 may include the reset transistor RS, the first source follower transistor SF1, the first selection transistor SEL1, the second selection transistor SEL2, and the second source follower transistor SF2. The source area S and the drain area D of each of the reset transistor RS, first source follower transistor SF1, the first selection transistor SEL1, the second selection transistor SEL2, and the second source follower transistor SF2 may be configured by the first to sixth impurity areas 132-1, 132-2, 134-1, 136, 134-2, and 138, which are arranged along the first direction (the X direction) and are spaced apart from each other ("isolated from direct contact with each other"). The source area S and the drain area D of each of the reset transistor RS, the first source follower transistor SF1, the first selection transistor SEL1, the second selection transistor SEL2, and the second source follower transistor SF2 configured by the first to sixth impurity areas 132-1, 132-2, 134-1, 136, 134-2, and 138 may be alternately arranged along the first direction (the X direction).

The first to sixth impurity areas 132-1, 132-2, 134-1, 136, 134-2, and 138 may be provided in a portion adjacent to the first surface 102a of the substrate 102. In some embodiments, the first to sixth impurity areas 132-1, 132-2, 134-1, 136, 134-2, and 138 may each be an n-type high concentration impurity area.

Each of the reset gate electrode 122 of the reset transistor RS, the first source follower gate electrode 124-1 of the first source follower transistor SF1, the first selection gate electrode 126-1 of the first selection transistor SEL1, the second selection gate electrode 126-2 of the second selection transistor SEL2, and the second source follower gate electrode 124-2 of the second source follower transistor SF2 may be disposed on the first surface 102a of the substrate 102 with the gate insulation layer 104 therebetween.

An interconnection structure 160 may be provided between the pixel area PA and the transistor area TA. The interconnection structure 160 may be formed on the first surface 102a of the substrate 102 to cover the photodiode PD, the transfer transistor TF, the floating diffusion area FD, and the transistor set 120. The interconnection structure 160 may include, for example, a plurality of interconnections 162, an interlayer insulation layer 164, and a plurality of contacts 166. In some embodiments, the plurality of interconnections 162 included in the interconnection structure 160 may have a multi-layer structure. The plurality of contacts 166 may vertically connect the plurality of interconnections 162 to each other, or may vertically connect the plurality of interconnections 162 to the gate electrodes 122, 124-1, 124-2, 126-1, 126-2, and 128, the source area S, the drain area D, or the floating diffusion area FD.

In the present specification, since the plurality of interconnections 162 and the plurality of contacts 166 have a three-dimensional connection relationship in the interconnection structure 160, only some of the plurality of interconnections 162 and the plurality of contacts 166 are illustrated, and a connection relationship between the plurality of interconnections 162 and the plurality of contacts 166 is conceptually shown through first to fifth interconnection structures 180, 182, 184, 186, and 188 illustrated in FIGS. 1A to 4D.

Therefore, some of the plurality of interconnections 162 and some of the plurality of contacts 166 may configure all or some of the first to third interconnection structures 180, 182, and 184 illustrated in FIGS. 1A to 1D.

Accordingly, although in FIGS. 1C and 1D the plurality of interconnections 162 and the plurality of contacts 166 are illustrated as not being connected to each other, some of the plurality of interconnections 162 may be connected to each other, or some of the plurality of interconnections 162 and some of the plurality of contacts 166 may be connected to each other.

The isolation area 140 may be disposed adjacent to each of the both ends of the transistor set 120, namely, the first impurity area 132-1, which is the source area S of the reset transistor RS, and the sixth impurity area 138, which is the drain area D of the second source follower transistor SF2.

The pixel isolation area 150 is illustrated as extending in a direction from the first surface 102a of the substrate 102 to the inside of the substrate 102, but is not limited thereto. In some embodiments, the pixel isolation area 150 may extend in a direction from the second surface 102b of the substrate to the inside of the substrate 102. The pixel isolation area 150 may extend from the first surface 102a of the substrate 102 to the second surface 102b of the substrate 102.

Figure 1E:
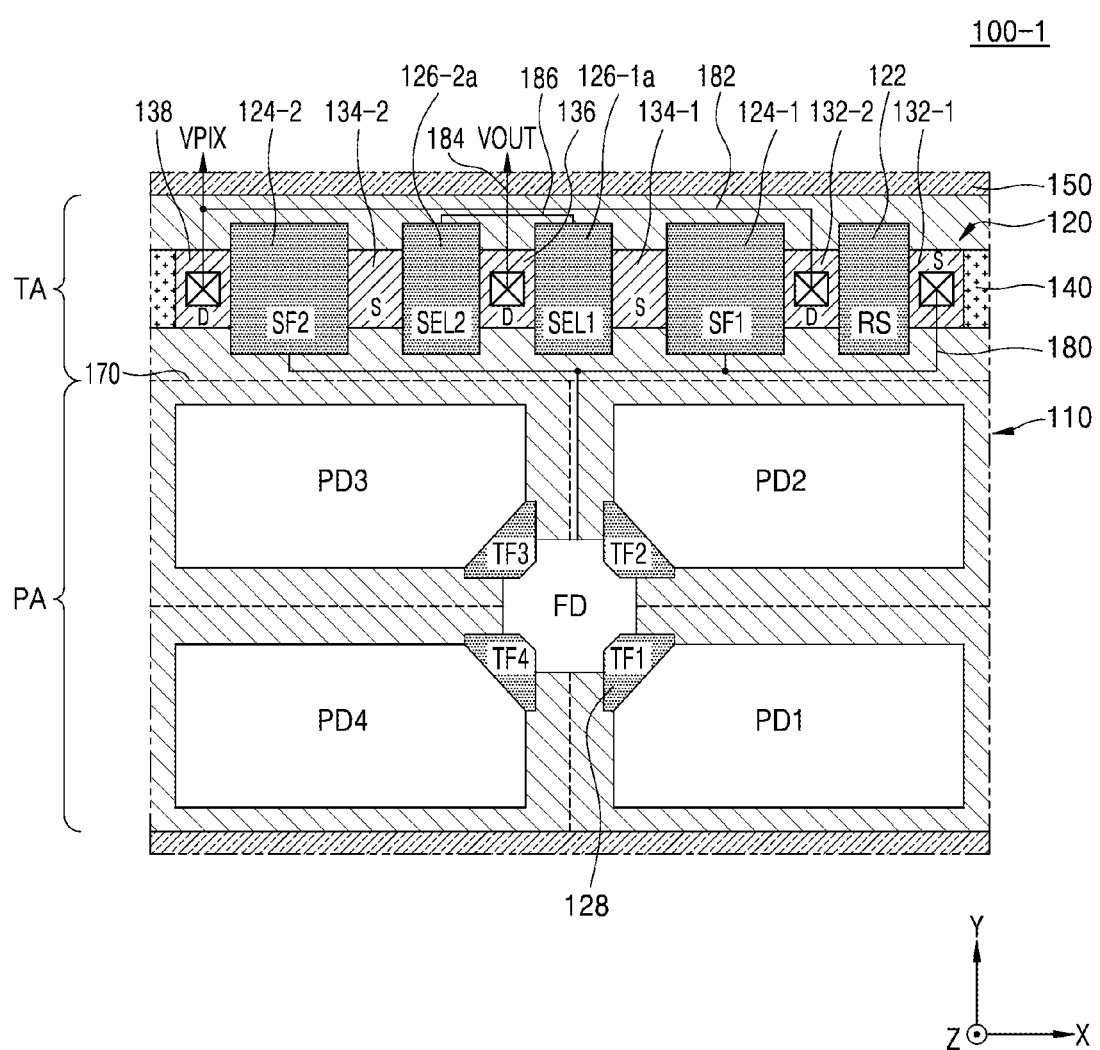
FIG. 1E is a plan view of the main portion of the unit pixel of the image sensor according to some example embodiments.

FIG. 1E is a plan view of a main portion of a unit pixel of an image sensor 100-1 according to some example embodiments. In the description with reference to FIG. 1E, repeated descriptions given above with reference to FIG. 1A are omitted.

Referring to FIG. 1E, a transistor set 120 including a reset transistor RS, a first source follower transistor SF1, a first selection transistor SEL1, a second selection transistor SEL2, and a second source follower transistor SF2 may be disposed in a transistor area TA of the image sensor 100-1. In the image sensor 100 illustrated in FIG. 1A, the coupling selection gate electrode 126M may include the first selection gate electrode 126-1 of the first selection transistor SEL1 and the second selection gate electrode 126-2 of the second selection transistor SEL2 which are provided as one body. On the other hand, in FIG. 1E, a first selection gate electrode 126-1a of the first selection transistor SEL1 and a second selection gate electrode 126-2a of the second selection transistor SEL2 may be spaced apart from each other ("isolated from direct contact with each other"). The first selection gate electrode 126-1a and the second selection gate electrode 126-2a may be electrically connected to each other through a fourth interconnection structure 186. A whole portion or a portion of the fourth interconnection structure 186 may be configured by some of the plurality of interconnections 162 and some of the plurality of contacts 166 described above with reference to FIG. 1C.

Figure 2A:
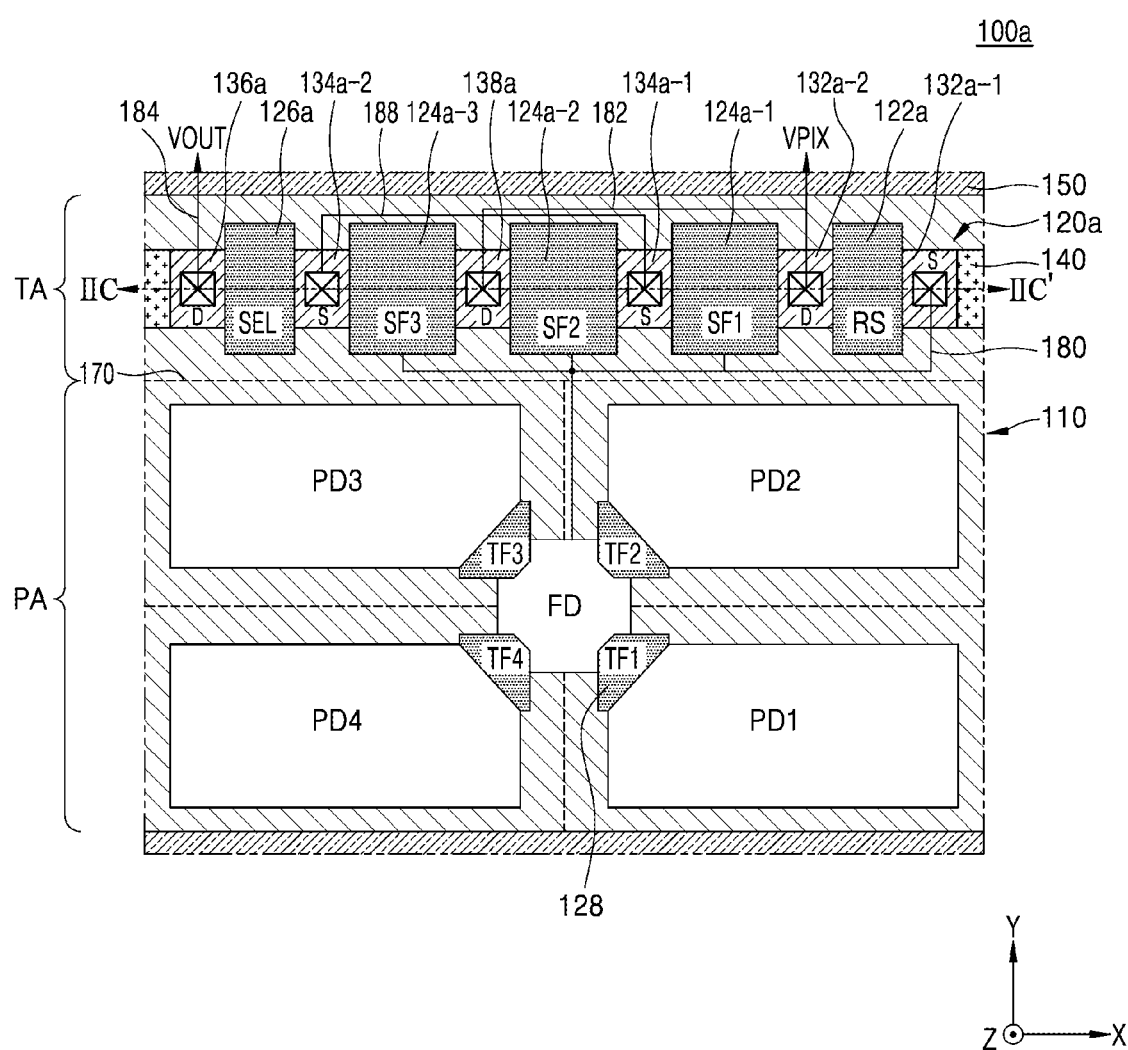
FIG. 2A is a plan view of a main portion of a unit pixel of an image sensor according to some example embodiments.
Figure 2B:
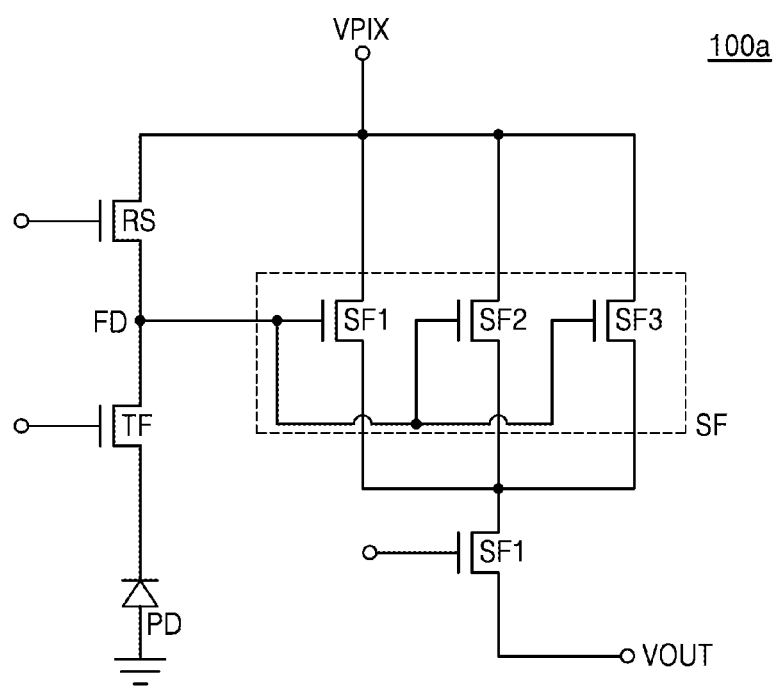
FIG. 2B is an equivalent circuit diagram corresponding to the unit pixel of the image sensor according to some example embodiments.
Figure 2C:
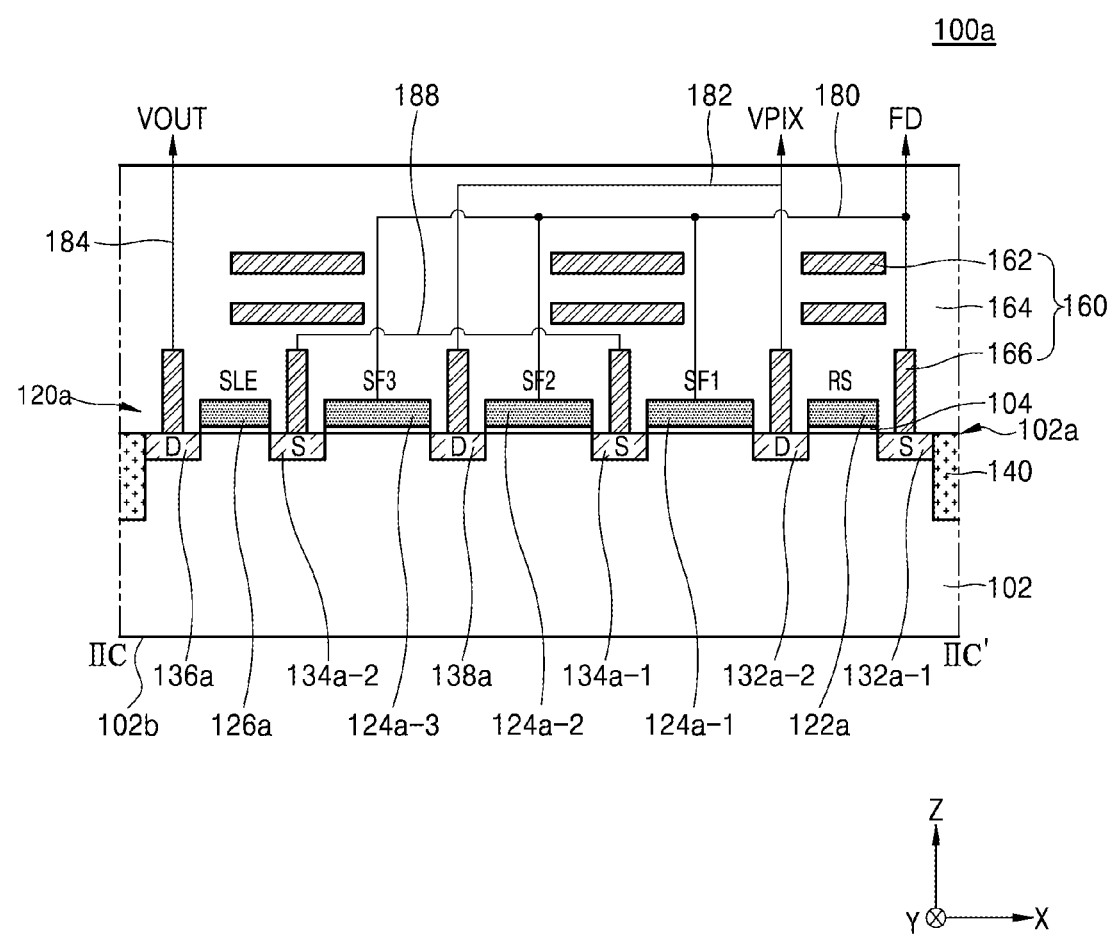
FIG. 2C is a cross-sectional view of the main portion of the unit pixel of the image sensor according to some example embodiments.

FIG. 2A is a plan view of a main portion of a unit pixel of an image sensor 100a according to some example embodiments, and FIG. 2B is an equivalent circuit diagram corresponding to the unit pixel of the image sensor 100a according to some example embodiments. FIG. 2C is a cross-sectional view of the main portion of the unit pixel of the image sensor 100a according to some example embodiments. In detail, FIG. 2C is a cross-sectional view taken along line IIC-IIC' of FIG. 2A. In the descriptions with reference to FIGS. 2A to 2C, repeated descriptions given above with reference to FIGS. 1A to 1E are omitted.

Referring to FIGS. 2A to 2C, the image sensor 100a may include a pixel area PA and a transistor area TA. A pixel 110 may be provided in the pixel area PA, and a transistor set 120a may be provided in the transistor area TA. The pixel 110 may include a plurality of photodiodes PD1 to PD4 and a floating diffusion area FD.

A plurality of transistors RS, SF1, SF2, SF3, and SEL1 included in the transistor set 120a, as illustrated in FIGS. 2A and 2C, may be arranged along a first direction (an X direction). The transistor set 120a may include a reset transistor RS, a first source follower transistor SF1, a second source follower transistor SF2, a third source follower transistor SF3, and a selection transistor SEL.

The reset transistor RS may include a reset gate electrode 122a and first and second impurity areas 132a-1 and 132a-2 provided next to both sides of the reset gate electrode 122a, the first source follower transistor SF1 may include a first source follower gate electrode 124a-1 and the second impurity area 132a-2 and a third impurity area 134a-1 provided next to both sides of the first source follower gate electrode 124a-1, the second source follower transistor SF2 may include a second source follower gate electrode 124a-2 and the third impurity area 134a-1 and a fourth impurity area 138a provided next to both sides of the second source follower gate electrode 124a-2, the third source follower transistor SF3 may include a third source follower gate electrode 124a-3 and the fourth impurity area 138a and a fifth impurity area 134a-2 provided next to both sides of the third source follower gate electrode 124a-3, and the selection transistor SEL may include a selection gate electrode 126a-1 and the fifth impurity area 134a-2 and a sixth impurity area 136a provided next to both sides of the selection gate electrode 126a-1. The first to sixth impurity areas 132a-1, 132a-2, 134a-1, 138a, 134a-2, and 138a may each be, for example, an n-type high concentration impurity area.

The reset transistor RS and the first source follower transistor SF1 may share the second impurity area 132a-2 as a drain area D, the first source follower transistor SF1 and the second source follower transistor SF2 may share the third impurity area 134a-1 as a source area S, the second source follower transistor SF2 and the third source follower transistor SF3 may share the fourth impurity area 138a as a drain area D, and the third source follower transistor SF3 and the selection transistor SEL may share the fifth impurity area 134a-2 as a source area S.

The first impurity area 132a-1, which is the source area S of the reset transistor RS, and the floating diffusion area FD may be electrically connected to each other through a first interconnection structure 180 to have an equivalent potential. Also, the first source follower gate electrode 124a-1 of the first source follower transistor SF1, the second source follower gate electrode 124a-2 of the second source follower transistor SF2, and the third source follower gate electrode 124a-3 of the third source follower transistor SF3 may be electrically connected to the floating diffusion area FD through the first interconnection structure 180. Therefore, the first impurity area 132a-1, which is the source area S of the reset transistor RS, the first to third source follower gate electrodes 124a-1 to 124a-3, and the floating diffusion area FD may all have an equivalent potential.

The second impurity area 132a-2, which is the drain area D shared by the reset transistor RS and the first source follower transistor SF1, and the fourth impurity area 138a, which is the drain area D shared by the second and third source follower transistors SF2, and SF3 may be connected to a source voltage VPIX terminal. The second impurity area 132a-2 and the fourth impurity area 138a may be connected to the source voltage VPIX terminal through a second interconnection structure 182.

An output voltage VOUT may be output through the sixth impurity area 136a, which is the drain area D of the selection transistor SEL. The output voltage VOUT may be output through a third interconnection structure 184 connected to the sixth impurity area 136a.

The transistor set 120a disposed in the transistor area TA of the image sensor 100a may be configured with five transistors RS, SF1, SF2, SF3, and SEL which are arranged along the first direction (the X direction) in adjacency to the pixel area PA. The five transistors RS, SF1, SF2, SF3, and SEL may share a source area S or a drain area D between two adjacent transistors and may be arranged along the first direction (the X direction). Therefore, the source area S and the drain area D of each of the five transistors RS, SF1, SF2, SF3, and SEL included in the transistor set 120a may be configured by six impurity areas 132a-1, 132a-2, 134a-1, 138a, 134a-2, and 138a, which are arranged along the first direction (the X direction) and are spaced apart from each other ("isolated from direct contact with each other").

The source area S and the drain area D of each of the five transistors RS, SF1, SF2, SF3, and SEL configured by the six impurity areas 132a-1, 132a-2, 134a-1, 138a, 134a-2, and 138a may be alternately arranged along the first direction (the X direction).

The first to sixth impurity areas 132a-1, 132a-2, 134a-1, 138a, 134a-2, and 136a may be provided in a portion adjacent to the first surface 102a of the substrate 102. In some embodiments, the first to sixth impurity areas 132a-1, 132a-2, 134a-1, 138a, 134a-2, and 136a may each be an n-type high concentration impurity area.

An isolation area 140 may be disposed adjacent to each of both ends of the transistor set 120a, namely, the first impurity area 132a-1, which is the source area S of the reset transistor RS, and the sixth impurity area 136a, which is the drain area D of the selection transistor SEL.

In the image sensor 100a according to some example embodiments, three source follower transistors SF1 to SF3 may be connected to each other in parallel. Also, the first source follower transistor SF1 and the second source follower transistor SF2 may share a source area S, and the third source follower transistor SF3 and the selection transistor SEL may share a source area S. Also, the source area S shared by the first and second source follower transistors SF1 and SF2 and the source area S of the third source follower transistor SF3 may be electrically connected to each other through a fifth interconnection structure 186.

Therefore, if a width of the transistor area TA in a second direction (a Y direction) is narrow, the first to third source follower transistors SF1 to SF3 connected to each other in parallel may perform a function of one source follower transistor SF having a relatively wide channel width, and thus, a transconductance of the source follower transistor SF is improved, thereby increasing a signal transfer speed of the image sensor 100a.

Figure 3A:
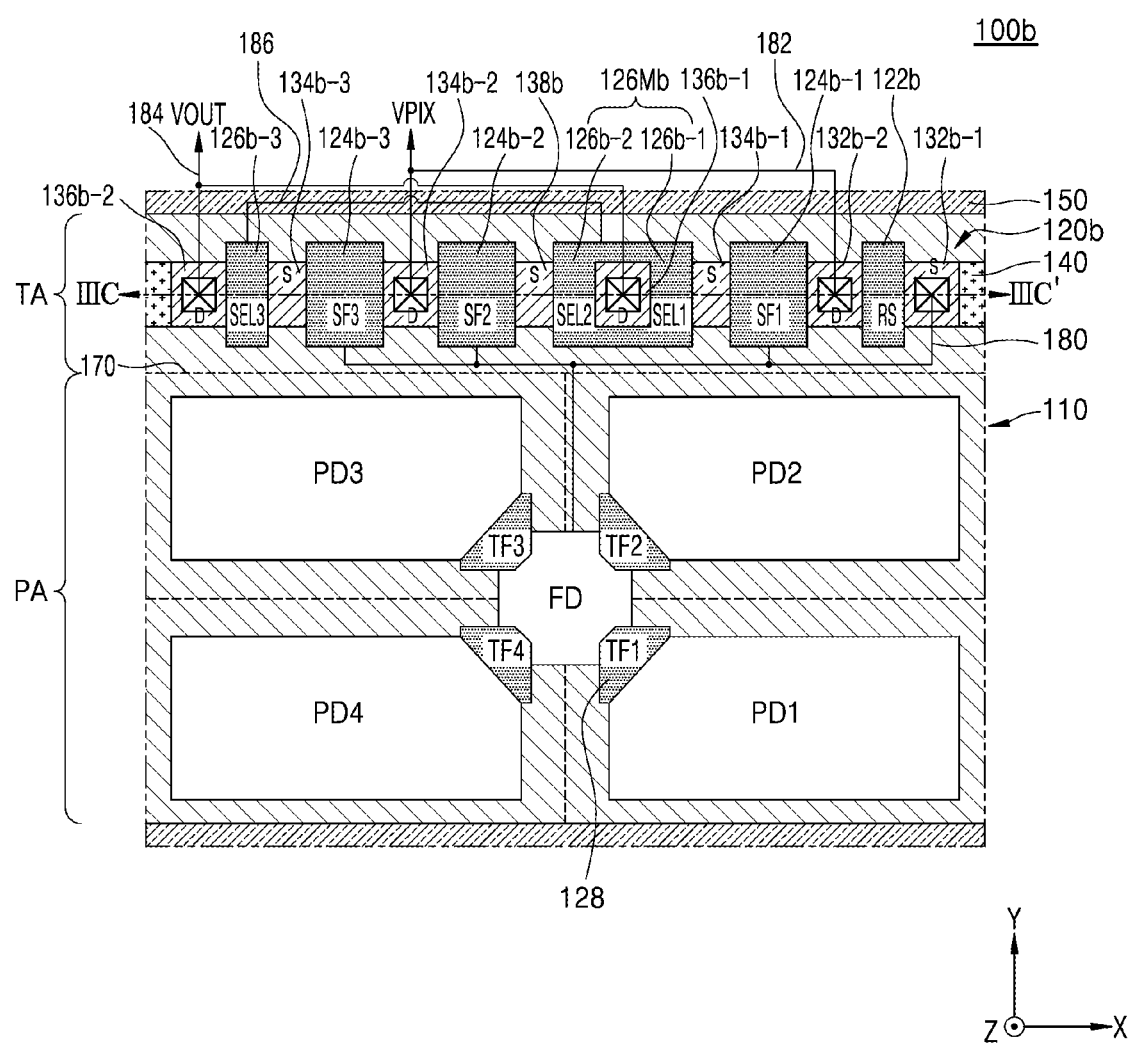
FIG. 3A is a plan view of a main portion of a unit pixel of an image sensor according to some example embodiments.
Figure 3B:
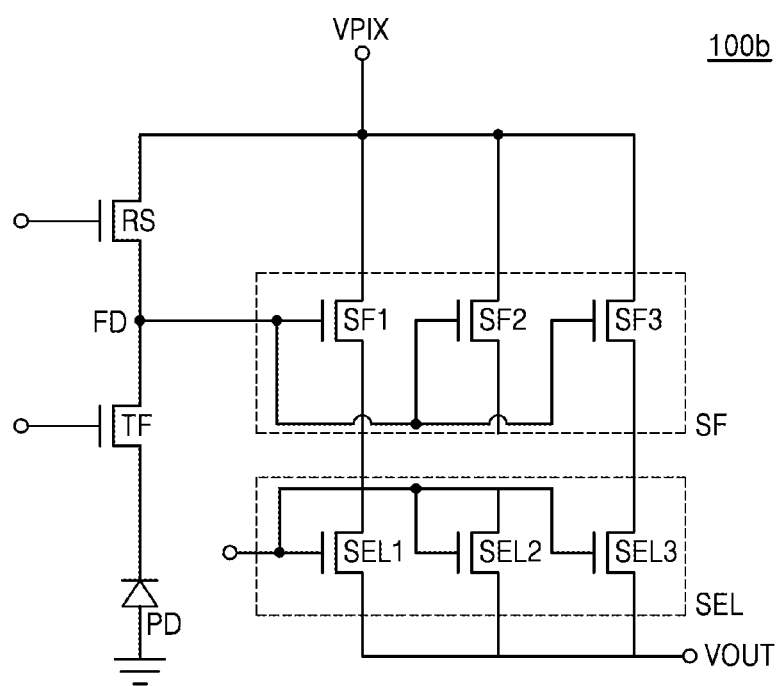
FIG. 3B is an equivalent circuit diagram corresponding to the unit pixel of the image sensor according to some example embodiments.
Figure 3C:
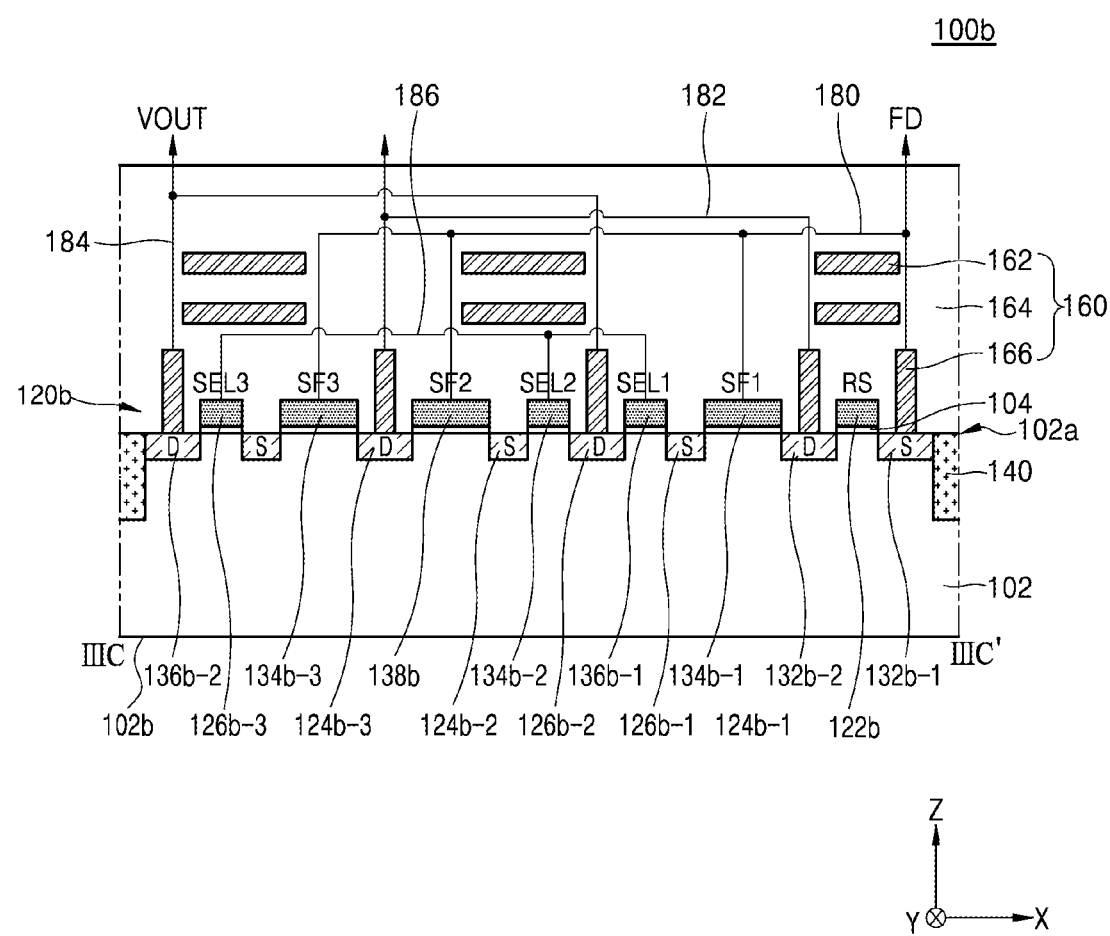
FIG. 3C is a cross-sectional view of the main portion of the unit pixel of the image sensor according to some example embodiments.

FIG. 3A is a plan view of a main portion of a unit pixel of an image sensor 100b according to some example embodiments, and FIG. 3B is an equivalent circuit diagram corresponding to the unit pixel of the image sensor 100b according to some example embodiments. FIG. 3C is a cross-sectional view of the main portion of the unit pixel of the image sensor 100b according to some example embodiments. In detail, FIG. 3C is a cross-sectional view taken along line IIIC-IIIC∝ of FIG. 3A. In the descriptions with reference to FIGS. 3A to 3C, repeated descriptions given above with reference to FIGS. 1A to 1D are omitted.

Referring to FIGS. 3A to 3C, the image sensor 100b may include a pixel area PA and a transistor area TA. A pixel 110 may be provided in the pixel area PA, and a transistor set 120b may be provided in the transistor area TA. The pixel 110 may include a plurality of photodiodes PD1 to PD4 and a floating diffusion area FD.

A plurality of transistors RS, SF1, SEL1, SEL2, SF2, SF3, and SEL3 included in the transistor set 120b, as illustrated in FIGS. 3A and 3C, may be arranged along a first direction (an X direction). The transistor set 120b may include a reset transistor RS, a first source follower transistor SF1, a first selection transistor SEL1, a second selection transistor SEL2, a second source follower transistor SF2, a third source follower transistor SF3, and a third selection transistor SEL3.

The reset transistor RS may include a reset gate electrode 122b and first and second impurity areas 132b-1 and 132b-2 provided next to both sides of the reset gate electrode 122b, the first source follower transistor SF1 may include a first source follower gate electrode 124b-1 and the second impurity area 132b-2 and a third impurity area 134b-1 provided next to both sides of the first source follower gate electrode 124*b*-1, the first selection transistor SEL1 may include a first selection gate electrode 126*b*-1 and the third impurity area 134*b*-1 and a fourth impurity area 136*b*-1 provided next to both sides of the first selection gate electrode 126*b*-1, the second selection transistor SEL2 may include a second selection gate electrode 126*b*-2 and the fourth impurity area 136*b*-1 and a fifth impurity area 134*b*-2 provided next to both sides of the second selection gate electrode 126*b*-2, the second source follower transistor SF2 may include a second source follower gate electrode 124*b*-2 and the fifth impurity area 134*b*-2 and a sixth impurity area 138*b* provided next to both sides of the second source follower gate electrode 124*b*-2, the third source follower transistor SF3 may include a third source follower gate electrode 124*b*-3 and the sixth impurity area 138*b* and a seventh impurity area 134*b*-3 provided next to both sides of the third source follower gate electrode 124*b*-3, and the third selection transistor SEL3 may include a third selection gate electrode 126*b*-3 and the seventh impurity area 134*b*-3 and an eighth impurity area 136*b*-2 provided next to both sides of the third selection gate electrode 126*b*-3. The first to eighth impurity areas 132*b*-1, 132*b*-2, 134*b*-1, 136*b*-1, 134*b*-2, 138*b*, 134*b*-3, and 136*b*-2 may each be, for example, an n-type high concentration impurity area.

The reset transistor RS, the first source follower transistor SF1, the first selection transistor SEL1, the second selection transistor SEL2, and the second source follower transistor SF2 of the transistors RS, SF1, SEL1, SEL2, SF2, SF3, and SEL3 of the transistor set 120*b* are similar to the transistor set 120 illustrated in FIGS. 1A and 1C, and thus, their detailed descriptions are omitted. Unlike the transistor set 120 illustrated in FIGS. 1A and 1C, the transistor set 120*b* may further include the third source follower transistor SF3 and the third selection transistor SEL3.

The second source follower transistor SF2 and the third source follower transistor SF3 may share the sixth impurity area 138*b* as a drain area D, and the third source follower transistor SF3 and the third selection transistor SEL3 may share the seventh impurity area 134*b*-3 as a source area S.

The first impurity area 132*b*-1, which is the source area S of the reset transistor RS, and the floating diffusion area FD may be electrically connected to each other through a first interconnection structure 180 to have an equivalent potential. Also, the first source follower gate electrode 124*b*-1 of the first source follower transistor SF1, the second source follower gate electrode 124*b*-2 of the second source follower transistor SF2, and the third source follower gate electrode 124*a*-3 of the third source follower transistor SF3 may be electrically connected to the floating diffusion area FD through the first interconnection structure 180. Therefore, the first impurity area 132*b*-1, which is the source area S of the reset transistor RS, the first to third source follower gate electrodes 124*b*-1 to 124*b*-3, and the floating diffusion area FD may all have an equivalent potential.

The second impurity area 132*b*-2, which is the drain area D shared by the reset transistor RS and the first source follower transistor SF1, and the sixth impurity area 138*b*, which is the drain area D shared by the second and third source follower transistors SF2 and SF3, may be connected to a source voltage VPIX terminal. The second impurity area 132*b*-2 and the sixth impurity area 138*b* may be connected to the source voltage VPIX terminal through a second interconnection structure 182.

An output voltage VOUT may be output through the fourth impurity area 136*b*-1, which is the drain area D shared by the first and second selection transistors SEL1 and SEL2, and the eighth impurity area 136*b*-2, which is the drain area D of the third selection transistor SEL3. The output voltage VOUT may be output through a third interconnection structure 184 connected to the fourth impurity area 136*b*-1 and the eighth impurity area 136*b*-2.

The first selection gate electrode 126*b*-1 of the first selection transistor SEL1 and the second selection gate electrode 126*b*-2 of the second selection transistor SEL2 may be configured as one body (e.g., included in one common body) and may be different parts of a coupling selection gate electrode 126Mb. Restated, two adjacent selection transistors may include separate, respective gate electrodes that are included in one common body. The coupling selection gate electrode 126Mb and the third selection gate electrode 126*b*-3 may be electrically connected to each other by a fourth interconnection structure 186. Restated, two adjacent selection transistors may include separate, respective gate electrodes that are electrically connected. The separate, respective gate electrodes may be isolated from direct contact with each other.

The transistor set 120*b* disposed in the transistor area TA of the image sensor 100*b* may be configured with seven transistors RS, SF1, SEL1, SEL2, SF2, SF3, and SEL3 which are arranged along the first direction (the X direction) in adjacency to the pixel area PA. The seven transistors RS, SF1, SEL1, SEL2, SF2, SF3, and SEL3 may share a source area S or a drain area D between two adjacent transistors and may be arranged along the first direction (the X direction). Therefore, the source area S and the drain area D of each of the seven transistors RS, SF1, SEL1, SEL2, SF2, SF3, and SEL3 included in the transistor set 120*b* may be configured by eight impurity areas 132*b*-1, 132*b*-2, 134*b*-1, 136*b*-1, 134*b*-2, 138*b*, 134*b*-3, and 136*b*-2, which are arranged along the first direction (the X direction) and are spaced apart from each other ("isolated from direct contact with each other").

The source area S and the drain area D of each of the seven transistors RS, SF1, SEL1, SEL2, SF2, SF3, and SEL3 configured by the eight impurity areas 132*b*-1, 132*b*-2, 134*b*-1, 136*b*-1, 134*b*-2, 138*b*, 134*b*-3, and 136*b*-2 may be alternately arranged along the first direction (the X direction).

The first to eighth impurity areas 132*b*-1, 132*b*-2, 134*b*-1, 136*b*-1, 134*b*-2, 138*b*, 134*b*-3, and 136*b*-2 may be provided in a portion adjacent to a first surface 102*a* of a substrate 102. In some embodiments, the first to eighth impurity areas 132*b*-1, 132*b*-2, 134*b*-1, 136*b*-1, 134*b*-2, 138*b*, 134*b*-3, and 136*b*-2 may each be an n-type high concentration impurity area.

An isolation area 140 may be disposed adjacent to each of both ends of the transistor set 120*b*, namely, the first impurity area 132*b*-1, which is the source area S of the reset transistor RS, and the eighth impurity area 136*b*-2, which is the drain area D of the third selection transistor SEL3.

In the image sensor 100*b* according to some example embodiments, three source follower transistors SF1 to SF3 may be connected to each other in parallel, and three selection transistors SEL1 to SEL3 may be connected to each other in parallel. Also, the first source follower transistor SF1 and the first selection transistor SEL1 may share a source area S, the second source follower transistor SF2 and the second selection transistor SEL2 may share a source area S, and the third source follower transistor SF3 and the third selection transistor SEL3 may share a source area S.

Therefore, if a width of the transistor area TA in a second direction (a Y direction) is narrow, the first to third source follower transistors SF1 to SF3 connected to each other in parallel may perform a function of one source follower transistor SF having a relatively wide channel width, and thus, a transconductance of the source follower transistor SF is improved, thereby increasing a signal transfer speed of the image sensor 100b.

Moreover, the first to third selection transistors SEL1 to SEL3 connected to each other in parallel may perform a function of one selection transistor SEL having a wide channel width, and thus, RC delay caused by a reduction in resistance of the selection transistor SEL when seen from an output terminal through which the output voltage VOUT is output is reduced, thereby increasing the signal transfer speed of the image sensor 100b.

Figure 3D:
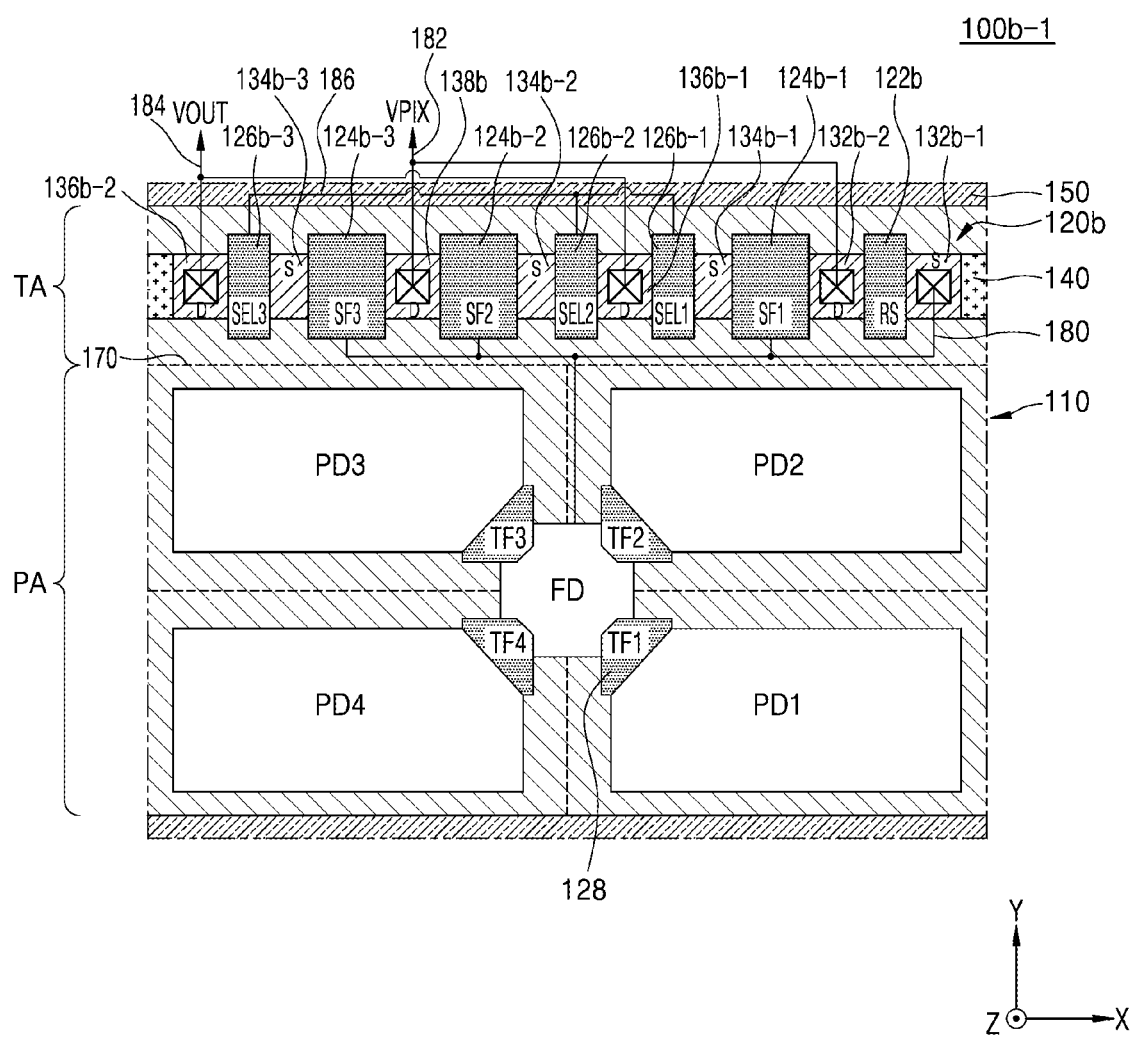
FIG. 3D is a plan view of the main portion of the unit pixel of the image sensor according to some example embodiments.

FIG. 3D is a plan view of a main portion of a unit pixel of an image sensor 100b-1 according to some example embodiments. In the description with reference to FIG. 3D, repeated descriptions given above with reference to FIGS. 1E and 3A are omitted.

Referring to FIG. 3D, a transistor set 120b including a reset transistor RS, a first source follower transistor SF1, a first selection transistor SEL1, a second selection transistor SEL2, a second source follower transistor SF2, a third source follower transistor SF3, and a third selection transistor SEL3 may be disposed in a transistor area TA of the image sensor 100b-1. In the image sensor 100b illustrated in FIG. 3A, the coupling selection gate electrode 126M may include the first selection gate electrode 126b-1 of the first selection transistor SEL1 and the second selection gate electrode 126b-2 of the second selection transistor SEL2 which are provided as one body. On the other hand, in FIG. 3D, a first selection gate electrode 126b-1a of the first selection transistor SEL1 and a second selection gate electrode 126b-2a of the second selection transistor SEL2 may be spaced apart from each other ("isolated from direct contact with each other"). The first selection gate electrode 126b-1a, the second selection gate electrode 126b-2a, and a third selection gate electrode 126b-3 may be electrically connected to each other through a fourth interconnection structure 186.

Figure 4A:
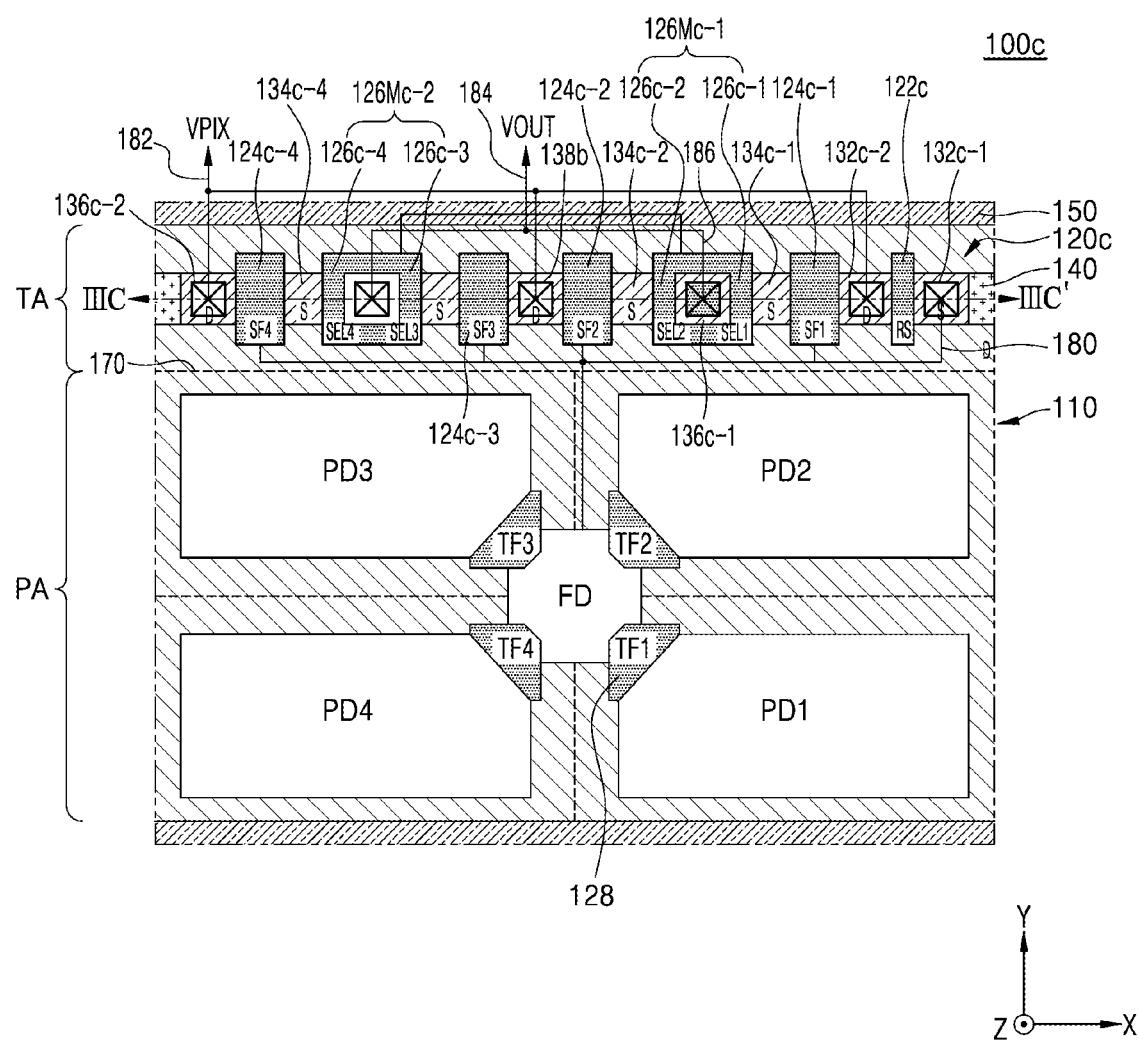
FIG. 4A is a plan view of a main portion of a unit pixel of an image sensor according to some example embodiments.
Figure 4B:
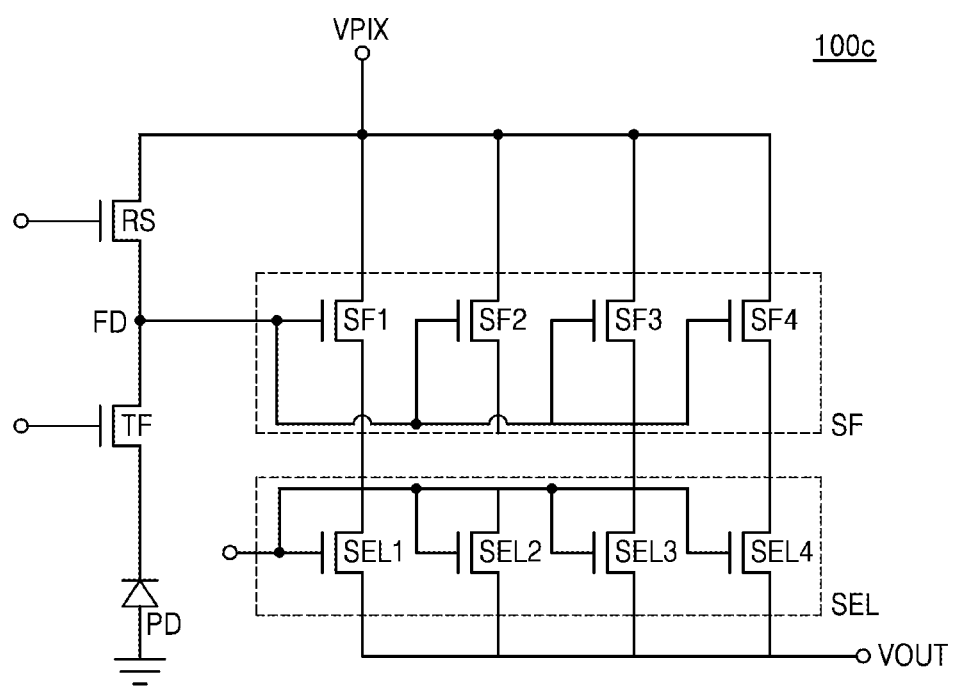
FIG. 4B is an equivalent circuit diagram corresponding to the unit pixel of the image sensor according to some example embodiments.
Figure 4C:
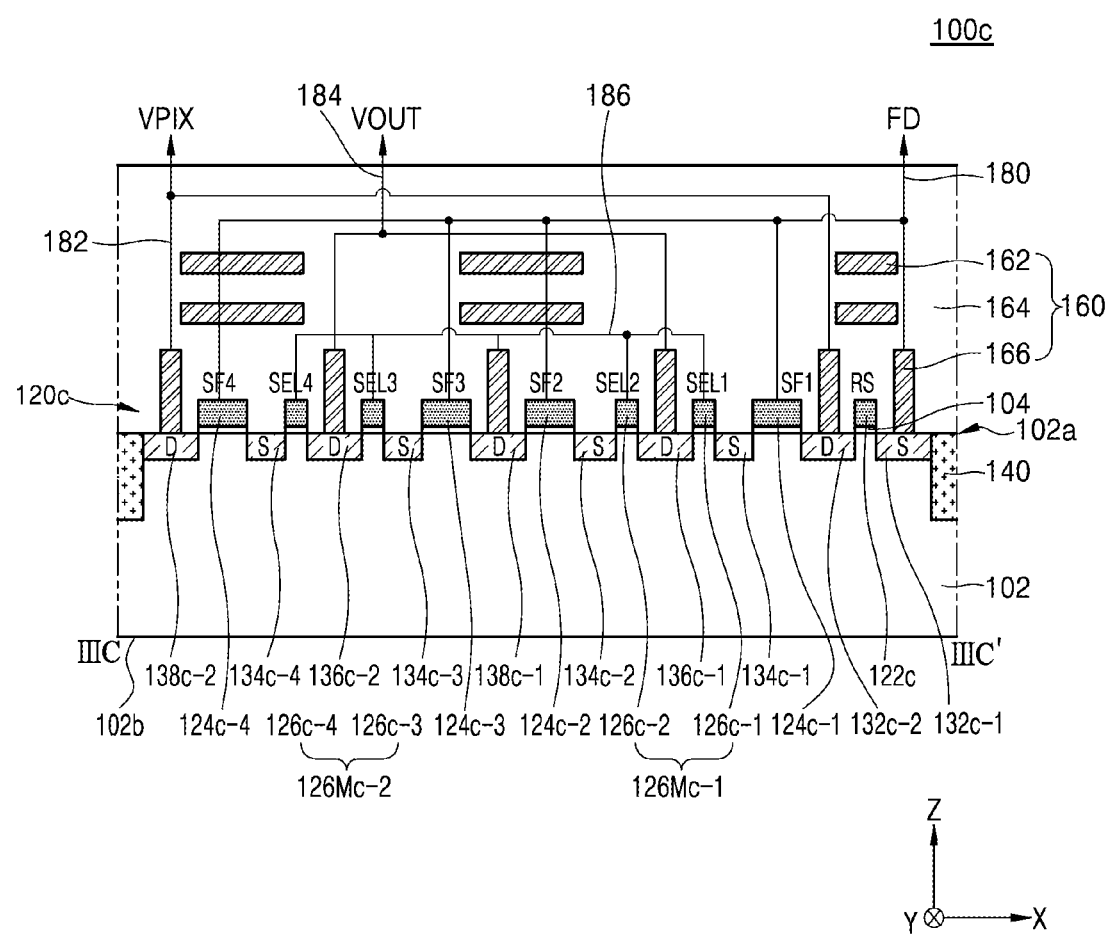
FIG. 4C is a cross-sectional view of the main portion of the unit pixel of the image sensor according to some example embodiments.

FIG. 4A is a plan view of a main portion of a unit pixel of an image sensor 100c according to some example embodiments, and FIG. 4B is an equivalent circuit diagram corresponding to the unit pixel of the image sensor 100c according to some example embodiments. FIG. 4C is a cross-sectional view of the main portion of the unit pixel of the image sensor 100c according to some example embodiments. In detail, FIG. 4C is a cross-sectional view taken along line IVC-IVC' of FIG. 4A. In the descriptions with reference to FIGS. 4A to 4C, repeated descriptions given above with reference to FIGS. 1A to 1D and 3A to 3C are omitted.

Referring to FIGS. 4A to 4C, the image sensor 100c may include a pixel area PA and a transistor area TA. A pixel 110 may be provided in the pixel area PA, and a transistor set 120c may be provided in the transistor area TA. The pixel 110 may include a plurality of photodiodes PD1 to PD4 and a floating diffusion area FD.

A plurality of transistors RS, SF1, SEL1, SEL2, SF2, SF3, SEL3, SEL4, and SF4 included in the transistor set 120c, as illustrated in FIGS. 4A and 4C, may be arranged along a first direction (an X direction). The transistor set 120c may include a reset transistor RS, a first source follower transistor SF1, a first selection transistor SEL1, a second selection transistor SEL2, a second source follower transistor SF2, a third source follower transistor SF3, a third selection transistor SEL3, a fourth selection transistor SEL4, and a fourth source follower transistor SF4.

The reset transistor RS may include a reset gate electrode 122c and first and second impurity areas 132c-1 and 132c-2 provided next to both sides of the reset gate electrode 122c, the first source follower transistor SF1 may include a first source follower gate electrode 124c-1 and the second impurity area 132c-2 and a third impurity area 134c-1 provided next to both sides of the first source follower gate electrode 124c-1, the first selection transistor SEL1 may include a first selection gate electrode 126c-1 and the third impurity area 134c-1 and a fourth impurity area 136c-1 provided next to both sides of the first selection gate electrode 126c-1, the second selection transistor SEL2 may include a second selection gate electrode 126c-2 and the fourth impurity area 136c-1 and a fifth impurity area 134c-2 provided next to both sides of the second selection gate electrode 126c-2, the second source follower transistor SF2 may include a second source follower gate electrode 124c-2 and the fifth impurity area 134c-2 and a sixth impurity area 138c-1 provided next to both sides of the second source follower gate electrode 124c-2, the third source follower transistor SF3 may include a third source follower gate electrode 124c-3 and the sixth impurity area 138c-1 and a seventh impurity area 134c-3 provided next to both sides of the third source follower gate electrode 124c-3, the third selection transistor SEL3 may include a third selection gate electrode 126c-3 and the seventh impurity area 134c-3 and an eighth impurity area 136c-2 provided next to both sides of the third selection gate electrode 126c-3, the fourth selection transistor SEL4 may include a fourth selection gate electrode 126c-4 and the eighth impurity area 136c-2 and a ninth impurity area 134c-4 provided next to both sides of the fourth selection gate electrode 126c-4, and the fourth source follower transistor SF4 may include a fourth source follower gate electrode 124c-4 and the ninth impurity area 134c-4 and a tenth impurity area 138c-2 provided next to both sides of the fourth source follower gate electrode 124c-4. The first to tenth impurity areas 132c-1, 132c-2, 134c-1, 136c-1, 134c-2, 138c-1, 134c-3, 136c-2, 134c-4, and 138c-2 may each be, for example, an n-type high concentration impurity area.

The reset transistor RS, the first source follower transistor SF1, the first selection transistor SEL1, the second selection transistor SEL2, and the second source follower transistor SF2 of the transistors RS, SF1, SEL1, SEL2, SF2, SF3, SEL3, SEL4, and SF4 of the transistor set 120c are similar to the transistor set 120 illustrated in FIGS. 1A and 1C, and thus, their detailed descriptions are omitted. Unlike the transistor set 120 illustrated in FIGS. 1A and 1C, the transistor set 120c may further include the third source follower transistor SF3, the third selection transistor SEL3, the fourth selection transistor SEL4, and the fourth source follower transistor SF4. Therefore, the transistor set 120c may be configured by arranging two transistor sets 120 which are the same as the transistor set 120 illustrated in FIGS. 1A and 1C, and in the transistor set 120c, source follower transistors facing each other in each of the two transistor sets 120 may share a drain area D.

Likewise, the reset transistor RS, the first source follower transistor SF1, the first selection transistor SEL1, the second selection transistor SEL2, the second source follower transistor SF2, the third source follower transistor SF3, and the third selection transistor SEL3 of the transistors RS, SF1, SEL1, SEL2, SF2, SF3, SEL3, SEL4, and SF4 of the transistor set 120c are similar to the transistor set 120b illustrated in FIGS. 3A and 3C. Unlike the transistor set 120b illustrated in FIGS. 3A and 3C, the transistor set 120c may further include the fourth selection transistor SEL4 and the fourth source follower transistor SF4.

The third selection transistor SEL3 and the fourth selection transistor SEL4 may share the eighth impurity area 136c-2 as a drain area D, and the fourth selection transistor SEL4 and the fourth source follower transistor SF4 may share the ninth impurity area 134c-4 as a source area S.

The first impurity area 132c-1, which is the source area S of the reset transistor RS, and the floating diffusion area FD may be electrically connected to each other through a first interconnection structure 180 to have an equivalent potential. Also, first to fourth source follower gate electrodes 124c-1 to 124c-4 of the respective first to fourth source follower transistors SF1 to SF4 may be electrically connected to the floating diffusion area FD through the first interconnection structure 180. Therefore, the first impurity area 132c-1, which is the source area S of the reset transistor RS, the first to fourth source follower gate electrodes 124c-1 to 124c-4, and the floating diffusion area FD may all have an equivalent potential.

The second impurity area 132c-2, which is the drain area D shared by the reset transistor RS and the first source follower transistor SF1, the sixth impurity area 138c-1, which is the drain area D shared by the second and third source follower transistors SF2 and SF3, and the tenth impurity area 138c-2, which is the drain area D of the fourth source follower transistor SF4, may be connected to a source voltage VPIX terminal. The second impurity area 132c-2, the sixth impurity area 138c-1, and the tenth impurity area 138c-2 may be connected to the source voltage VPIX terminal through a second interconnection structure 182.

An output voltage VOUT may be output through the fourth impurity area 136c-1, which is the drain area D shared by the first and second selection transistors SEL1 and SEL2, and the eighth impurity area 136c-2, which is the drain area D shared by the third and fourth selection transistors SEL3 and SEL4. The output voltage VOUT may be output through a third interconnection structure 184 connected to the fourth impurity area 136c-1 and the eighth impurity area 136c-2.

The first selection gate electrode 126c-1 of the first selection transistor SEL1 and the second selection gate electrode 126c-2 of the second selection transistor SEL2 may be configured as one body and may be different parts of a first coupling selection gate electrode 126Mc-1. The third selection gate electrode 126c-3 of the third selection transistor SEL3 and the fourth selection gate electrode 126c-4 of the fourth selection transistor SEL4 may be configured as one body and may be different parts of a second coupling selection gate electrode 126Mc-2. The first coupling selection gate electrode 126Mc-1 and the second coupling selection gate electrode 126Mc-2 may be electrically connected to each other by a fourth interconnection structure 186.

The transistor set 120c disposed in the transistor area TA of the image sensor 100c may be configured with nine transistors RS, SF1, SEL1, SEL2, SF2, SF3, SEL3, SEL4, and SF4 which are arranged along the first direction (the X direction) in adjacency to the pixel area PA. The nine transistors RS, SF1, SEL1, SEL2, SF2, SF3, SEL3, SEL4, and SF4 may share a source area S or a drain area D between two adjacent transistors and may be arranged along the first direction (the X direction). Therefore, the source area S and the drain area D of each of the nine transistors RS, SF1, SEL1, SEL2, SF2, SF3, SEL3, SEL4, and SF4 included in the transistor set 120c may be configured by ten impurity areas 132c-1, 132c-2, 134c-1, 136c-1, 134c-2, 138c-1, 134c-3, 136c-2, 134c-4, and 138c-2, which are arranged along the first direction (the X direction) and are spaced apart from each other ("isolated from direct contact with each other").

The source area S and the drain area D of each of the nine transistors RS, SF1, SEL1, SEL2, SF2, SF3, SEL3, SEL4, and SF4 configured by the ten impurity areas 132c-1, 132c-2, 134c-1, 136c-1, 134c-2, 138c-1, 134c-3, 136c-2, 134c-4, and 138c-2 may be alternately arranged along the first direction (the X direction).

The first to tenth impurity areas 132c-1, 132c-2, 134c-1, 136c-1, 134c-2, 138c-1, 134c-3, 136c-2, 134c-4, and 138c-2 may be provided in a portion adjacent to a first surface 102a of a substrate 102. In some embodiments, the first to tenth impurity areas 132c-1, 132c-2, 134c-1, 136c-1, 134c-2, 138c-1, 134c-3, 136c-2, 134c-4, and 138c-2 may each be an n-type high concentration impurity area.

An isolation area 140 may be disposed adjacent to each of both ends of the transistor set 120c, namely, the first impurity area 132c-1, which is the source area S of the reset transistor RS, and the tenth impurity area 138c-2, which is the drain area D of the fourth source follower transistor SF4.

In the image sensor 100c according to some example embodiments, four source follower transistors SF1 to SF4 may be connected to each other in parallel, and four selection transistors SEL1 to SEL4 may be connected to each other in parallel. Also, the first source follower transistor SF1 and the first selection transistor SEL1 may share a source area S, the second source follower transistor SF2 and the second selection transistor SEL2 may share a source area S, the third source follower transistor SF3 and the third selection transistor SEL3 may share a source area S, and the fourth source follower transistor SF4 and the fourth selection transistor SEL4 may share a source area S.

Therefore, if a width of the transistor area TA in a second direction (a Y direction) is narrow, the first to fourth source follower transistors SF1 to SF4 connected to each other in parallel may perform a function of one source follower transistor SF having a relatively wide channel width, and thus, a transconductance of the source follower transistor SF is improved, thereby increasing a signal transfer speed of the image sensor 100c.

Moreover, the first to fourth selection transistors SEL1 to SEL4 connected to each other in parallel may perform a function of one selection transistor SEL having a wide channel width, and thus, RC delay caused by a reduction in resistance of the selection transistor SEL when seen from an output terminal through which the output voltage VOUT is output is reduced, thereby increasing the signal transfer speed of the image sensor 100c.

Figure 4D:
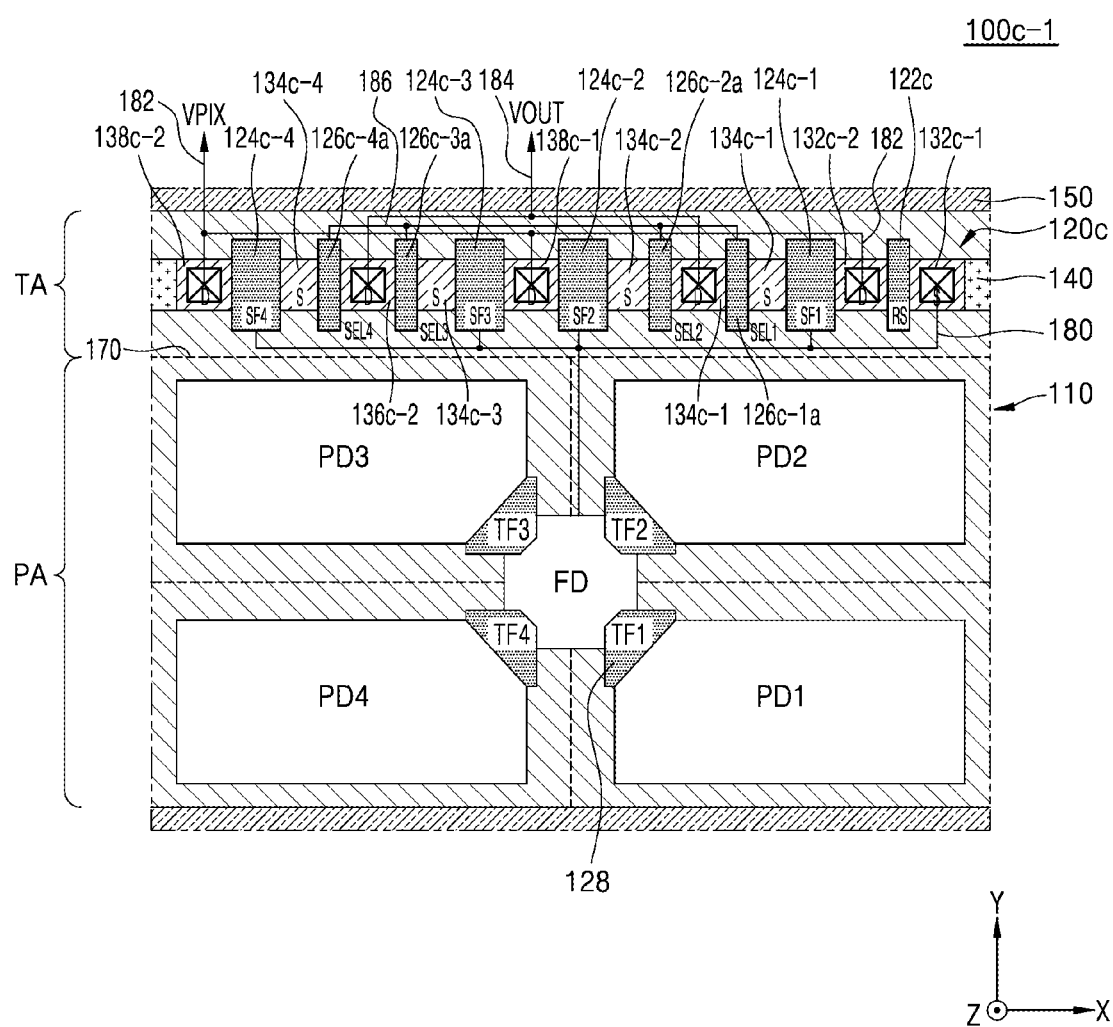
FIG. 4D is a plan view of the main portion of the unit pixel of the image sensor according to some example embodiments.

FIG. 4D is a plan view of a main portion of a unit pixel of an image sensor 100c-1 according to some example embodiments. In the description with reference to FIG. 4D, repeated descriptions given above with reference to FIGS. 1E, 3D, and 4A are omitted.

Referring to FIG. 4D, a transistor set 120c including a reset transistor RS, a first source follower transistor SF1, a first selection transistor SEL1, a second selection transistor SEL2, a second source follower transistor SF2, a third source follower transistor SF3, a third selection transistor SEL3, a fourth selection transistor SEL4, and a fourth source follower transistor SF4 may be disposed in a transistor area TA of the image sensor 100c-1. In the image sensor 100c illustrated in FIG. 4A, the first coupling selection gate electrode 126Mc-1 may include the first selection gate electrode 126c-1 of the first selection transistor SEL1 and the second selection gate electrode 126c-2 of the second selection transistor SEL2 which are provided as one body, and the second coupling selection gate electrode 126Mc-4 may include the third selection gate electrode 126c-3 of the third selection transistor SEL3 and the fourth selection gate electrode 126c-4 of the fourth selection transistor SEL4 which are provided as one body. On the other hand, in FIG. 4D, a first selection gate electrode 126c-1a of the first selection transistor SEL1 and a second selection gate electrode 126c-2a of the second selection transistor SEL2 may be spaced apart from each other ("isolated from direct contact with each other"), and a third selection gate electrode 126c-3a of the third selection transistor SEL3 and a fourth selection gate electrode 126c-4a of the fourth selection transistor SEL4 may be spaced apart from each other ("isolated from direct contact with each other"). The first to fourth selection gate electrodes 126c-1a to 126c-4a may be electrically connected to each other through a fourth interconnection structure 186.

FIG. 5 is a diagram illustrating a schematic configuration of an image sensor 400 according to some example embodiments.

Referring to FIG. 5 along with FIGS. 1A to 4D, the image sensor 400 according to some example embodiments may include a transistor set including n number of transistors arranged in one direction, and the transistor set may include one reset transistor, k number of source follower transistors, and m number of selection transistors. Restated, a transistor set may include a plurality of transistors that includes a reset transistor, a plurality of source follower transistors, and at least one selection transistor. Here, n is k+m+1, m is an integer equal to or more than one (e.g., the transistor set includes at least one selection transistor), k is an integer equal to or more than two or is equal to or more than m (e.g., the transistor set includes at least one source follower transistor, and k+m is an even number equal to or more than four. Restated, a total quantity of the transistors in the transistor set (e.g., the plurality of source follower transistors and the at least one selection transistor), is an even quantity and is at least four transistors.

Moreover, the one reset transistor and a source follower transistor adjacent thereto, which are included in the transistor set, may share a drain area thereof (e.g., the one reset transistor and an adjacent source follower transistor of the plurality of source follower transistors share a common drain area), and the k source follower transistors and the m selection transistors may be arranged and may each share a source area or a drain area between two adjacent transistors (e.g., adjacent transistors, of the plurality of source follower transistors and the at least one selection transistor, each share a source area between the adjacent transistors or a drain area between the adjacent transistors).

A source area and a drain area of each of the n transistors included in the transistor set may be configured by n+1 number of impurity areas, arranged along the one direction, and spaced apart from each other ("isolated from direct contact with each other"). Restated, each transistor of a plurality of transistors of the transistor set may include a source area and a drain area, the source area and the drain area of the transistor may be at least partially defined by a plurality of impurity areas, the source area and the drain area of the transistor may extend along the second direction, and the source area and the drain area of the transistor may be isolated from direct contact with each other.

For example, as illustrated in FIGS. 1A to 1E, the transistor set 120 may include one reset transistor RS, two source follower transistors SF1 and SF2, and two selection transistors SEL1 and SEL2. For example, as illustrated in FIGS. 3A to 3D, the transistor set 120b may include one reset transistor RS, three source follower transistors SF1 to SF3, and three selection transistors SEL1 to SEL3. For example, as illustrated in FIGS. 4A to 4C, the transistor set 120c may include one reset transistor RS, four source follower transistors SF1 to SF4, and four selection transistors SEL1 to SEL4.

Although not separately shown, by arranging, like the transistor set 120 illustrated in FIGS. 1A to 1E, an array of two source follower transistors and two selection transistors as one or two or more between the reset transistor RS and the first source follower transistor SF1 of the transistor set 120b illustrated in FIGS. 3A to 3D, a transistor set including one reset transistor, five source follower transistors, and five selection transistors may be configured, and additionally, a transistor set further including two source follower transistors and two selection transistors (for example, seven source follower transistors and seven selection transistors, nine source follower transistors and nine selection transistors, etc.) may be configured.

Moreover, although not separately shown, by arranging, like the transistor set 120 illustrated in FIGS. 1A to 1E, an array of two source follower transistors and two selection transistors as one or two or more between the reset transistor RS and the first source follower transistor SF1 of the transistor set 120c illustrated in FIGS. 4A to 4D, a transistor set including one reset transistor, six source follower transistors, and six selection transistors may be configured, and additionally, a transistor set further including two source follower transistors and two selection transistors (for example, eight source follower transistors and eight selection transistors, ten source follower transistors and ten selection transistors, etc.) may be configured.

Therefore, the image sensor according to some example embodiments may include a transistor set including n number of transistors arranged in one direction, and the transistor set may include one reset transistor and p number of source follower transistors and selection transistors (where n is 2*p+1 and is an odd number equal to or more than three, and p is an integer equal to or more than two). Restated, the transistor set may include a plurality of transistors that includes one reset transistor, a plurality of source follower transistors, and a plurality of selection transistors, where the plurality of selection transistors are equal in quantity to the plurality of source follower transistors, where a total quantity of transistors, of the plurality of source follower transistors and the plurality of selection transistors, may be an odd quantity and may be at least three transistors. The p source follower transistors and the p selection transistors included in the transistor set may configure p number of sub transistor sets including at least one first sub transistor set, including one source follower transistor and one selection transistor which are arranged in a particular direction deviating from the one reset transistor, and at least one second sub transistor set including one selection transistor and one source follower transistor which are arranged in a separate direction deviating from the one reset transistor, and the transistor set may include the first sub transistor set and the second sub transistor set which are alternately arranged.

For example, a first source follower transistor SF1 and a first selection transistor SEL1 may configure a first sub transistor set, and a third source follower transistor SF3 and a third selection transistor SEL3 may configure the first sub transistor set. Also, a second selection transistor SEL2 and a second source follower transistor SF2 may configure a second sub transistor set, and a fourth selection transistor SEL4 and a fourth source follower transistor SF4 may configure the second sub transistor set.

Therefore, the transistor set 120 illustrated in FIGS. 1A to 1E may be configured by sequentially arranging one reset transistor, a first sub transistor set, and a second sub transistor set, and the transistor set 120*b* illustrated in FIGS. 3A to 3D may be configured by sequentially arranging one reset transistor, one first sub transistor set, a second sub transistor set, and another first sub transistor set. Also, the transistor set 120*c* illustrated in FIGS. 4A to 4D may be configured by sequentially arranging one reset transistor, one first sub transistor set, one second sub transistor set, another first sub transistor set, and another second sub transistor set.

For example, as illustrated in FIGS. 2A to 2C, the transistor set 120*a* may include one reset transistor RS, three source follower transistors SF1 to SF3, and one selection transistor SEL.

Although not separately shown, by arranging, like the transistor set 120 illustrated in FIGS. 1A to 1E, an array of two source follower transistors and two selection transistors as one or two or more between the reset transistor RS and the first source follower transistor SF1 of the transistor set 120*a* illustrated in FIGS. 2A to 2C, a transistor set including one reset transistor, five source follower transistors, and three selection transistors may be configured, and additionally, a transistor set further including two source follower transistors and two selection transistors (for example, seven source follower transistors and five selection transistors, nine source follower transistors and seven selection transistors, etc.) may be configured. Restated, the plurality of source follower transistors may be two more in quantity than the at least one selection transistor.

Therefore, a separate isolation area may not be provided in a transistor set, and a plurality of source follower transistors or a plurality of source follower transistors and a plurality of selection transistors may be arranged, thereby increasing a signal transfer speed of an image sensor.

Referring to FIG. 5, the image sensor 400 according to some example embodiments may include a pixel part 420 and a peripheral circuit unit. The pixel part 420 may be configured by regularly arranging a plurality of pixels 410, including a photoelectric converter on a semiconductor substrate 401, in a two-dimensional array structure. The photoelectric converter may be, for example, a photodiode. Also, the pixels 410 may each include the pixel 110 applied to the image sensors 100, 100-1, 100*a*, 100*b*, 100*b*-1, 100*c*, and 100*c*-1 of FIGS. 1A to 4D and the transistor sets 120, 120*a*, 120*b*, and 120*c* corresponding thereto.

The peripheral circuit unit may be disposed near the pixel part 420 and may include a vertical driving circuit 440, a column signal processing circuit 450, a horizontal drive circuit 460, an output circuit 470, and a control circuit 480.

The control circuit 480 may control the vertical driving circuit 440, the column signal processing circuit 450, and the horizontal drive circuit 460. For example, the control circuit 480 may generate a clock signal or control signals for operations of the vertical driving circuit 440, the column signal processing circuit 450, and the horizontal drive circuit 460, based on a vertical synchronization signal, a horizontal synchronization signal, and a master clock. Also, the control circuit 480 may input the clock signal or the control signals to the vertical driving circuit 440, the column signal processing circuit 450, and the horizontal drive circuit 460.

The vertical driving circuit 440 may include, for example, a shift register. The vertical driving circuit 440 may select a pixel driving interconnection and may supply a pulse for driving pixels to the selected pixel driving interconnection, thereby driving the pixels in units of one row. For example, the vertical driving circuit 440 may sequentially and selectively supply the pulse to the pixels 410 of the pixel part 420 in a vertical direction in units of one row. Also, the vertical driving circuit 440 may allow a pixel signal based on electrical charges, generated by the photoelectric converter (for example, a photodiode) of each of the pixels 410, to be supplied to the column signal processing circuit 450 through a vertical signal line 432.

The column signal processing circuit 450 may be provided for each column where a plurality of pixels 410 are arranged, and may perform signal processing, such as noise removal and/or the like, on a signal output from a pixel 410 of one column. For example, the column signal processing circuit 450 may perform signal processing, such as correlated-double sampling, signal amplification, analog-to-digital (AD) conversion, and/or the like, for removing unique noise of the pixel 410. A horizontal selection switch (not shown) may be installed in an output terminal of the column signal processing circuit 450.

The horizontal drive circuit 460 may include, for example, a shift register. The horizontal drive circuit 460 may sequentially output a horizontal scan pulse to sequentially select the column signal processing circuits 450 and may output a pixel signal of each of the column signal processing circuits 450 to a horizontal signal line 434.

The output circuit 470 may perform signal processing on signals sequentially supplied through the horizontal signal line 434 from the respective column signal processing circuits 450 and may output signals obtained through the signal processing. For example, the output circuit 470 may only perform buffering, level adjustment, column non-uniform correction, various digital signal processing, or the like. An input and output terminal 490 may exchange a signal with the outside.

Figure 6:
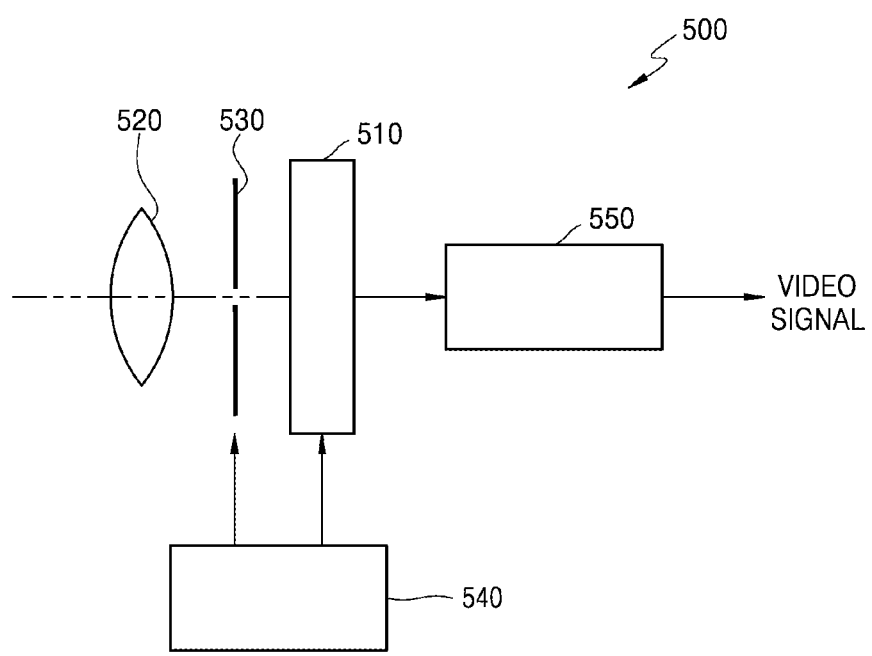
FIG. 6 is a diagram illustrating a schematic configuration of an electronic device including an image sensor according to some example embodiments.

FIG. 6 is a diagram illustrating a schematic configuration of an electronic device 500 including an image sensor according to some example embodiments.

Referring to FIG. 6, the electronic device 500 according to some example embodiments may include an image sensor 510, an optical system 520, a shutter 530, a driving circuit 540, and a signal processing circuit 550.

The image sensor 510 may be one of the image sensors 100, 100-1, 100*a*, 100*b*, 100*b*-1, 100*c*, and 100*c*-1 of FIGS. 1A to 4D. The image sensor 510 may include the pixel part 420 and the peripheral circuit unit as illustrated in FIG. 5.

The optical system 520 may be an element that may induce (e.g., "direct," "irradiate," etc.) incident light to a light receiving element of the image sensor 510 and may include a plurality of optical lenses. For example, the optical system 520 may irradiate light, which is incident from a subject, onto a photographing surface of the image sensor 510, and thus, electrical charges may be generated and accumulated in the image sensor 510.

The shutter 530 may control a light irradiation period and a light blocking period for the image sensor 510. The driving circuit 540 may supply a driving signal for controlling a transfer operation of the image sensor 510 and an operation of the shutter 530. The image sensor 510 may transfer a signal according to the driving signal (or a timing signal) supplied from the driving circuit 540.

The signal processing circuit 550 may perform various signal processing techniques on an output signal of the image sensor 510. A video signal obtained through the signal processing may be stored in a recording medium such as a memory or the like, or may be output to a monitor.

The electronic device 500 according to some example embodiments may be, for example, a CMOS camera for capturing a still image or a moving image.

In the image sensor according to the embodiments, a plurality of source follower transistors connected to each other in parallel may perform a function of one source follower transistor having a relatively wide width, and thus, a transconductance of each source follower transistor is improved. Also, a plurality of selection transistors connected to each other in parallel may perform a function of one selection transistor having a relatively wide width, thereby decreasing RC delay caused by a reduction in resistance of a selection transistor when seen from an output terminal. Accordingly, a signal transfer speed of the image sensor increases.

Moreover, since an isolation area for junction isolation should not be disposed in a transistor set, dark current or noise is limited and/or prevented from occurring in the separation area.

While the inventive concepts has been particularly shown and described with reference to embodiments thereof, it will be understood that various changes in form and details may be made therein without departing from the spirit and scope of the following claims.

What is claimed is:

1. An image sensor comprising:
    a pixel area, the pixel area including
        a photodiode, and
        a floating diffusion area; and
    a transistor area adjacent to the pixel area in a first direction, the transistor area including
        a transistor set, the transistor set including a plurality of transistors extending along an edge of the pixel area in a linear sequence that is aligned with an axis that extends through the plurality of transistors along a second direction perpendicular to the first direction, the plurality of transistors including
        one reset transistor,
        a plurality of source follower transistors, and
        at least one selection transistor,
        wherein a total quantity of transistors, of the plurality of source follower transistors and the at least one selection transistor, is an even quantity and is at least four transistors,
        wherein the one reset transistor and an adjacent source follower transistor of the plurality of source follower transistors share a drain area, and
        wherein each set of adjacent transistors, of the plurality of source follower transistors and the at least one selection transistor, each share a source area between the adjacent transistors or a drain area between the adjacent transistors, such that a source area and a drain area of each transistor of the plurality of transistors are aligned with the axis and alternately arranged along the axis such that the axis extends through each source area and drain area along the second direction.

2. The image sensor of claim 1, wherein a gate electrode of each source follower transistor of the plurality of source follower transistors, a source area of the one reset transistor, and the floating diffusion area are electrically connected to each other, such that the gate electrode of each source follower transistor, the source area of the one reset transistor, and the floating diffusion have a common potential.

3. The image sensor of claim 1, wherein each transistor of the plurality of transistors of the transistor set include separate, respective source areas and drain areas, the source areas and the drain areas of the plurality of transistors are at least partially defined by a plurality of impurity areas, the source area and the drain area of the transistor extend along the second direction, and the source area and the drain area of the transistor are isolated from direct contact with each other.

4. The image sensor of claim 1, wherein,
    the at least one selection transistor includes at least three selection transistors, and
    the source follower transistors of the plurality of source follower transistors share source areas with a separate, respective selection transistor of the at least three selection transistors.

5. The image sensor of claim 4, wherein the at least one selection transistor includes two adjacent selection transistors that share a common drain area.

6. The image sensor of claim 5, wherein the two adjacent selection transistors include separate, respective gate electrodes that are included in one common body.

7. The image sensor of claim 1, wherein the plurality of source follower transistors is two more in quantity than the at least one selection transistor.

8. An image sensor comprising:
    a pixel area, the pixel area including
        a photodiode, and
        a floating diffusion area; and
    a transistor area adjacent to the pixel area in a first direction, the transistor area including a transistor set, the transistor set including a plurality of transistors extending along an edge of the pixel area in a linear sequence that is aligned with an axis that extends through the plurality of transistors along a second direction perpendicular to the first direction, the plurality of transistors including
        one reset transistor,
        a plurality of source follower transistors, and
        a plurality of selection transistors, the plurality of selection transistors being equal in quantity to the plurality of source follower transistors,
    wherein a total quantity of transistors, of the plurality of source follower transistors and the plurality of selection transistors, is an odd quantity and is at least three transistors,
    wherein the one reset transistor and one source follower transistor adjacent to the one reset transistor, among the plurality of source follower transistors, share a common drain area,
    wherein the plurality of source follower transistors and the plurality of selection transistors each share a common source area or a common drain area between each set of two adjacent transistors of the plurality of source follower transistors and the plurality of selection transistors,
    wherein two adjacent selection transistors of the plurality of selection transistors share a separate common drain area,
    wherein a source area and a drain area of each transistor of the plurality of transistors are aligned with the axis and alternately arranged along the axis such that the axis extends through each source area and drain area along the second direction.

9. The image sensor of claim 8, wherein
    the plurality of source follower transistors and the plurality of selection transistors are included in a plurality of sub transistor sets,
    the plurality of sub transistor sets includes at least one first sub transistor set, each first sub transistor set including one source follower transistor and one selection transistor extending in a particular direction that deviates from the one reset transistor,
    the plurality of sub transistor sets including at least one second sub transistor set, each second sub transistor set including one selection transistor and one source follower transistor extending in a separate direction that deviates from the one reset transistor, and the transistor set includes an alternating arrangement of first sub transistor sets and second sub transistor sets.

10. The image sensor of claim 8, wherein a gate electrode of each source follower transistor, a source area of the one reset transistor, and the floating diffusion area are electrically connected to each other, such that the gate electrode of each source follower transistor, the source area of the one reset transistor, and the floating diffusion have a common potential.

11. The image sensor of claim 8, wherein adjacent selection transistors of the plurality of selection transistors include separate, respective gate electrodes that are included in one common body and include an internal open space.

12. The image sensor of claim 8, wherein the plurality of source follower transistors share common source areas with separate, respective selection transistors of the plurality of selection transistors.

13. An image sensor, comprising:
a pixel area, the pixel area including
a photodiode, and
a floating diffusion area; and
a plurality of transistors adjacent to the pixel area and extending in a linear sequence that is aligned with an axis that extends through the plurality of transistors along an edge of the pixel area that extends along a direction, the plurality of transistors including
a reset transistor,
a plurality of source follower transistors, and
at least one selection transistor,
wherein the reset transistor and an adjacent source follower transistor of the plurality of source follower transistors share a common drain area, and
wherein each set of adjacent transistors, of the plurality of source follower transistors and the at least one selection transistor, each share a common source area between the adjacent transistors or a separate common drain area between the adjacent transistors, such that a source area and a drain area of each transistor of the plurality of transistors are aligned with the axis and alternately arranged along the axis such that the axis extends through each source area and drain area along the direction.

14. The image sensor of claim 13, wherein a gate electrode of each source follower transistor of the plurality of source follower transistors, a source area of the reset transistor, and the floating diffusion area are electrically connected to each other, such that the gate electrode of each source follower transistor, the source area of the reset transistor, and the floating diffusion have a common potential.

15. The image sensor of claim 13, wherein the source area and the drain area of each transistor of the plurality of transistors are at least partially defined by a plurality of impurity areas, the source area and the drain area extending along the edge of the pixel area, and the source area and the drain area are isolated from direct contact with each other.

16. The image sensor of claim 13, wherein,
the at least one selection transistor includes at least three selection transistors, and
each source follower transistor of the plurality of source follower transistors shares a source area with a separate selection transistor of the at least three selection transistors.

17. The image sensor of claim 16, wherein the at least one selection transistor includes two adjacent selection transistors that share a common drain area.

18. The image sensor of claim 17, wherein the two adjacent selection transistors include separate, respective gate electrodes that are included in one common body.

19. The image sensor of claim 17, wherein the two adjacent selection transistors include separate, respective gate electrodes that are electrically connected and are isolated from direct contact with each other.

20. The image sensor of claim 16, wherein the plurality of transistors includes a plurality of selection transistors.

* * * * *